United States Patent
Mano et al.

(10) Patent No.: US 6,570,456 B2
(45) Date of Patent: May 27, 2003

(54) CLOCK GENERATOR FOR GENERATING INTERNAL CLOCK SIGNAL SYNCHRONIZED WITH REFERENCE CLOCK SIGNAL

(75) Inventors: Ryuji Mano, Hyogo (JP); Tsutomu Yoshimura, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/152,009

(22) Filed: May 22, 2002

(65) Prior Publication Data

US 2002/0175722 A1 Nov. 28, 2002

(30) Foreign Application Priority Data

May 28, 2001 (JP) ........................................ 2001-159062

(51) Int. Cl.[7] ................................................ H03L 7/00
(52) U.S. Cl. ......................................... 331/11; 327/158
(58) Field of Search ................................. 327/149, 156, 327/158, 161, 153; 331/11, 25, 21, 47, 55

(56) References Cited

U.S. PATENT DOCUMENTS

| | | | | |
|---|---|---|---|---|
| 4,675,617 A | * | 6/1987 | Martin | 331/1 A |
| 5,475,344 A | * | 12/1995 | Maneatis et al. | 331/57 |
| 5,880,579 A | * | 3/1999 | Wei et al. | 323/282 |
| 5,909,150 A | * | 6/1999 | Kostelnik et al. | 331/34 |
| 6,259,293 B1 | * | 7/2001 | Hayase et al. | 327/276 |
| 6,333,652 B1 | * | 12/2001 | Iida et al. | 327/161 |
| 6,351,191 B1 | * | 2/2002 | Nair et al. | 331/57 |
| 6,356,158 B1 | * | 3/2002 | Lesea | 331/11 |

FOREIGN PATENT DOCUMENTS

JP          9-289447          11/1997

OTHER PUBLICATIONS

Tomochika Harada and Tadayoshi Enomoto, "Design of Source Voltage Controlled Oscillator (SVCO) and Phase Lock Loop Using SVCO", Technical Report of IEICE, vol. 100, No. 384, Oct. 23, 2000, p. 73.

* cited by examiner

Primary Examiner—Timothy P. Callahan
Assistant Examiner—Cassandra Cox
(74) Attorney, Agent, or Firm—McDermott, Will & Emery

(57) ABSTRACT

A signal according to a phase difference in a first phase-locked loop is transferred to a power supply line as an operation power supply voltage for a first oscillation circuit included in the first phase-locked loop. The potential of the power supply line is supplied to a second oscillation circuit in a second phase-locked loop as an operation power supply voltage. The second phase-locked loop is used to generate a clock signal phase-synchronized to the input clock signal. Consequently, a clock generator is implemented that oscillates at a central frequency to generate a recovered clock signal even when a variation is caused in a manufacturing parameter.

19 Claims, 15 Drawing Sheets

CLOCK GENERATOR FOR GENERATING INTERNAL CLOCK SIGNAL SYNCHRONIZED WITH REFERENCE CLOCK SIGNAL

BACKGROUND OF THE INVENTION

1. Field of the Invention

The present invention relates to a clock generating circuit, and more particularly to a clock synchronizing circuit for generating an internal clock signal synchronized in phase with a reference clock signal.

2. Description of the Background Art

FIG. 18 shows an example of a configuration of a conventional clock generator. By way of example, the figure shows a configuration of a phase synchronizing circuit (phase locked loop circuit (PLL circuit)) including a voltage controlled oscillating circuit of a ring oscillator type.

As shown in FIG. 18, the clock generator includes: a phase comparison circuit PH for comparing a phase of a reference clock signal having a predetermined cycle C and a phase of a recovered clock signal CO and producing a signal according to the phase difference; a charge pump/low pass filter CPLP including a charge pump performing a charge pumping operation according to the phase difference detection signal produced from the phase comparison circuit PH to generate a control voltage and a low pass filter for removing a high frequency component of the control voltage produced from the charge pump; a bias controlling circuit BK for generating bias voltages V1 and V2 in accordance with the control voltage from the charge pump/low pass filter; a voltage controlled oscillation circuit O having an oscillation frequency controlled in accordance with the bias voltages V1 and V2 from the bias control circuit BK. voltages produced by the charge pump. Bias control circuit BK generates bias voltages V1 and V2 according to the control voltages produced by charge pump/low pass filter CPLP. Voltage controlled oscillation circuit O controls oscillation frequencies according to bias voltages V1 and V2 produced by Bias control circuit BK.

Phase comparison circuit PH compares the phases of reference clock signal C and recovered clock signal CO, and produces an up-signal for increasing a frequency of the recovered clock signal CO or a down-signal for decreasing the frequency of the recovered clock signal CO in accordance with the phase difference.

In charge pump/low pass filter CPLP, the charge pump performs charge/discharge operation in response to the up- or down-signal received from phase comparison circuit PH, and the low pass filter performs the integration of the charged potential due to the charge/discharge current generated by the charge pump, for generating the control voltage. The low pass filter is normally called a loop filter.

Bias control circuit BK receives the control voltage from charge pump/low pass filter CPLP, and generates bias voltages V1 and V2 for adjusting the oscillation frequency of oscillation circuit O.

Oscillation circuit O includes an odd-number of stages of delay cells D1 to Dn coupled in a ring form. In delay cells D1 to Dn, a cell signal of a preceding stage is sequentially transferred to a delay cell of a subsequent delay cell, and the recovered clock signal CO generated from the final-stage delay cell Dn is fed-back to the delay cell D1 of the initial stage. Delay cells D1 to Dn each have an identical configuration, and therefore, in FIG. 18, reference characters are attached to components of only the final-stage delay cell Dn.

Delay cell Dn includes: a current source transistor MC1 having a driving current thereof controlled in accordance with the bias voltage V1; an insulated gate field effect transistor (referred to as an MOS transistor) M5 of a p channel type connected between the current source transistor MC1 and an output node, for receiving an output signal of the delay cell of a preceding stage at a gate thereof; an n-channel MOS transistor M6; and a current source transistor MC2 connected between MOS transistor M6 and the ground node, for receiving the bias voltage V2 at a gate thereof signal of the previous-stage delay cell. Current source transistor MC2 is coupled between MOS transistor M6 and a ground node, and the gate of transistor MC2 receives bias voltage V2.

Current source transistor MC1 is formed of a p-MOS transistor. Current source transistor MC2 is formed of an n-MOS transistor. Each of delay cells D1 to Dn is formed of a CMOS inverter having the driving current set current source transistors MC1 and MC2.

When the level of the bias voltage V1 rises, and the level of the bias voltage V2 decreases, the conductance of each of the current source transistors MC1 and MC2 are reduced, and the amount of the drive current thereof is reduced accordingly. Responsively, the operation speeds of delay cells D1 to Dn are reduced. Accordingly, the oscillation cycle of oscillation circuit O is increased, and the oscillation frequency thereof is reduced.

When the level of bias voltage V1 lowers and the level of the bias voltage V2 increases, the conductances of current source transistors MC1 and MC2 increase, and the amount of the drive current thereof increases. Responsively, the operation currents of the respective delay cells D1 to Dn increase, to increase the operation speeds thereof, and the oscillation cycle of oscillation circuit O decreased to increase the frequency of recovered clock signal CO.

The oscillation cycle of oscillation circuit O is controlled through bias voltages V1 and V2 in accordance with the phase difference between reference clock signal C and recovered clock signal CO, to synchronize in phase the reference clock signal C with the recovered clock signal CO. Thus, the recovered clock signal CO that tracks in frequency the reference clock signal C is generated.

FIG. 19 shows an example of the configuration of bias control circuit BK shown in FIG. 18. Referring to FIG. 19, bias control circuit BK includes: an n-MOS transistor M1 connected between a node AN and the ground node, and receiving the control voltage VC at a gate thereof; a p-channel MOS transistor M2 connected between a power supply node and node AN, and having a gate connected to node AN; a p-MOS transistor M3 connected between the power supply node and a node BN, and having a gate connected to node AN; and an n-MOS transistor M4 connected between node BN and the ground node, and having a gate connected to node BN.

MOS transistors M2 and M3 form a current mirror circuit, in which a mirror current of the current flowing through MOS transistor M2 flows through MOS transistor M3. That is, when MOS transistors M2 and M3 are the same in size (ratio of the channel width to the channel length) with each other, the currents of the same magnitude flow through MOS transistors M2 and M3.

Control voltage VC is supplied from charge pump/low pass filter CPLP shown in FIG. 18.

When the level of control voltage VC rises, the conductance of MOS transistor M1 increases, and the current flowing through MOS transistor M1 increases. The current is supplied to MOS transistor M1 from MOS transistor M2, the amount of the current flowing via MOS transistor M2 is thereby increased, and the current flowing via MOS transistor M3 is increased accordingly. Since MOS transistor M2 has the gate and drain thereof coupled together, and has the supply current thereof increased, the voltage level of node AN lowers. On the other hand, MOS transistor M4 has the gate and drain thereof coupled to node BN, and has to discharge the current supplied from MOS transistor M3. Accordingly, the voltage level of node BN rises.

Specifically, when control voltage VC increases, the level of bias voltage V1 lowers, while the level of bias voltage V2 rises, conversely. These bias voltages V1 and V2 are supplied to the gates of current source transistors MC1 and MC2, respectively. Thus, in oscillation circuit O, the operation currents of delay cells D1 to Dn increase, and the operation speeds thereof increase accordingly. Consequently, the oscillation cycle of oscillation circuit O is decreased, and the frequency of recovered clock signal CO is increased.

When the level of control voltage VC lowers, the conductance of MOS transistor M1 decreases, and the drive current thereof decreases. Accordingly, the amount of the supply current of MOS transistor M2 decreases, the gate to source voltage of MOS transistor M2 decreases, and the voltage level of node AN rises. In addition, through the current mirror operation, the amount of the current supplied via MOS transistor M3 is reduced to decrease the gate to source voltage of MOS transistor M4, resulting in a decreased voltage level of node BN. Accordingly, the level of bias voltage V1 increases and the level of bias voltage V2 decreases. Accordingly, in oscillation circuit O shown in FIG. 18, the operation currents of delay cells D1 to Dn are reduced, and the operation speeds thereof are reduced. Concurrently, delay times of delay cells D1 to Dn are increased to prolonged. For these reasons, the oscillation cycle of oscillation circuit O is decrease the frequency of recovered clock signal CO.

In phase comparison circuit PH, the up-signal/down-signal is generated in accordance with the lead/lag in the phase of recovered clock signal CO relative to reference clock signal C. In response to the up-signal/down-signal, control voltage VC is generated in charge pump/low pass filter CPLP. Thereby, the frequency and the phase of recovered clock signal CO are adjusted, and recovered clock signal CO phase-synchronized with reference clock signal C is generated.

FIG. 20 shows the relationship between control voltage VC and the frequency of recovered clock signal. As shown in FIG. 20, in proportion to the increase in control voltage VC, an oscillation frequency FB of the oscillator increases. Hereinbelow, a range of frequency in which the clock generator stably oscillates is referred to as a "frequency range", and a range of the control voltage at which voltage controlled oscillation circuit O operates is referred to as a "voltage range".

For a stable operation of a phase synchronization loop, it is desirable for the center value of the frequency range, central frequency, to coincide with a central value of the voltage range. Thereby, the oscillation frequency of voltage controlled oscillation circuit O can be increased or reduced by increasing or reducing control voltage VC with respect to the central frequency. This enables a phase-locked recovered clock signal CO to be stably generated at a high speed even when the frequency of reference clock signal C deviates from the central frequency. Generally, the circuit design is made such that central frequency fcm coincides with central value VCm of the voltage range. However, because of the occurrence of, for example, variations in transistor parameters in a manufacturing step, deviation frequently occurs between the designed value and the actual value after manufacture, and such deviation needs to be corrected.

FIG. 21 shows variations in the characteristics of voltage controlled oscillation circuit O shown in FIG. 18. In voltage controlled oscillation circuit O, as a design value, a voltage VCm is set as the middle value of control voltage for the central frequency. In this case, the characteristics of a typical voltage controlled oscillator (VCO) are obtained, in which the frequency linearly varies substantially in the frequency range according to control voltage VC.

When the operation speed of voltage controlled oscillation circuit O is increased because of, for example, variation in a transistor parameter in a manufacturing step, the designed central frequency is given by a control voltage VCa. That is, when the operation speed of voltage controlled oscillation circuit O is increased because of a variation in transistor parameter in a manufacturing step, VCO characteristics thereof deviate toward the left side in FIG. 21. Accordingly, the position of the central frequency shifts.

In contrast, when the operation speed of voltage controlled oscillation circuit O is reduced because of a variation in transistor parameter in a manufacturing step, a control voltage VCb needs to be supplied to control the frequency to be phase-synchronous to the designed central frequency. In this case, VCO characteristics deviate toward the right side in FIG. 21.

Specifically, with the same reference clock signal C applied, the lock voltage (control voltage) for phase synchronization varies because of variations in manufacturing parameters. Now, it is assumed that symbol KOm represents the sensitivity of the voltage controlled oscillator that has VCO characteristics coincident with design values (typical VCO characteristics). Sensitivity KOm is here defined to indicate the variation of the oscillation frequency with respect the variation of the control voltage VC. In this case, sensitivity KOa of a voltage controlled oscillator having fast VCO characteristics is higher than typical sensitivity KOm, while sensitivity KOb of a voltage controlled oscillator having slow VCO characteristics is lower than typical sensitivity KOm. In these voltage controlled oscillators having the VCO characteristics deviating from typical VCO characteristics, the variation of the oscillation frequency to the variation of the control voltage is different from the designed value. Consequently, a phase-synchronized, recovered clock signal can not be stably generated for the frequency deviating from the central frequency.

In particular, in a "high-sensitive" voltage controlled oscillator in which the central frequency is substantially fixed, and the frequency variation is small, the deviation needs to be corrected to cause oscillation to be made at the central frequency. In addition to the configuration that generates a recovered clock signal which is phase-synchronous with a single speed reference clock signal, there is a field requiring to reproduce multi speed clock signals. For example, in a communication field, since the data transmission rate is various, multi speed reference clock signals are transmitted in accordance with the applications, and it is required to recover clock signals corresponding to the received reference clock signal. In such a field, such a problem arises that if the VCO characteristics are deviated, recovered clock signals that are phase synchronous with or phase locked to the multi speed clock signals can not be generated accurately.

SUMMARY OF THE INVENTION

An object of the present invention is to provide a clock generator capable of optimally correcting a deviation in frequency characteristics caused in a manufacturing step.

Another object of the present invention is to provide a clock generator capable of controlling a voltage controlled oscillator to stably oscillate at a central frequency.

Still another object of the present invention is to provide a clock generator capable of generating recovered clock signals that are stably phase synchronous with a reference signal regardless of deviation in a manufacturing step.

A clock generator of the present invention includes: a first oscillator; a power supply controller for adjusting a potential of a power supply line for a first oscillator according to a phase difference between an oscillation signal of the first oscillator and a first reference clock signal; a second oscillator receiving the potential of the power supply line as an operation power supply voltage, for performing an oscillation operation; and a bias control circuit for adjusting an operation speed of the second oscillator according to a phase difference between an output signal of the second oscillator and a second reference clock signal.

According to the present invention, the potential of the power supply line of the first oscillator is adjusted in accordance with the phase difference between the oscillation signal of the first oscillator and first reference clock signal. The adjusted potential of the power supply line is supplied to the second oscillator as the operation power supply potential for the second oscillator. The operation speed of the second oscillator is adjusted according to the phase difference between the output signal of the second oscillator and the second reference clock signal. Thus, even when a variation occurs in manufacturing parameter, the frequency characteristics of the first oscillator are so adjusted as to compensate for the variation in the manufacturing parameter, and accordingly the frequency characteristics of the second oscillator can be adjusted. Therefore, regardless of the variation in the manufacturing parameter, the clock generator capable of stably operating with designed frequency characteristics can be implemented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
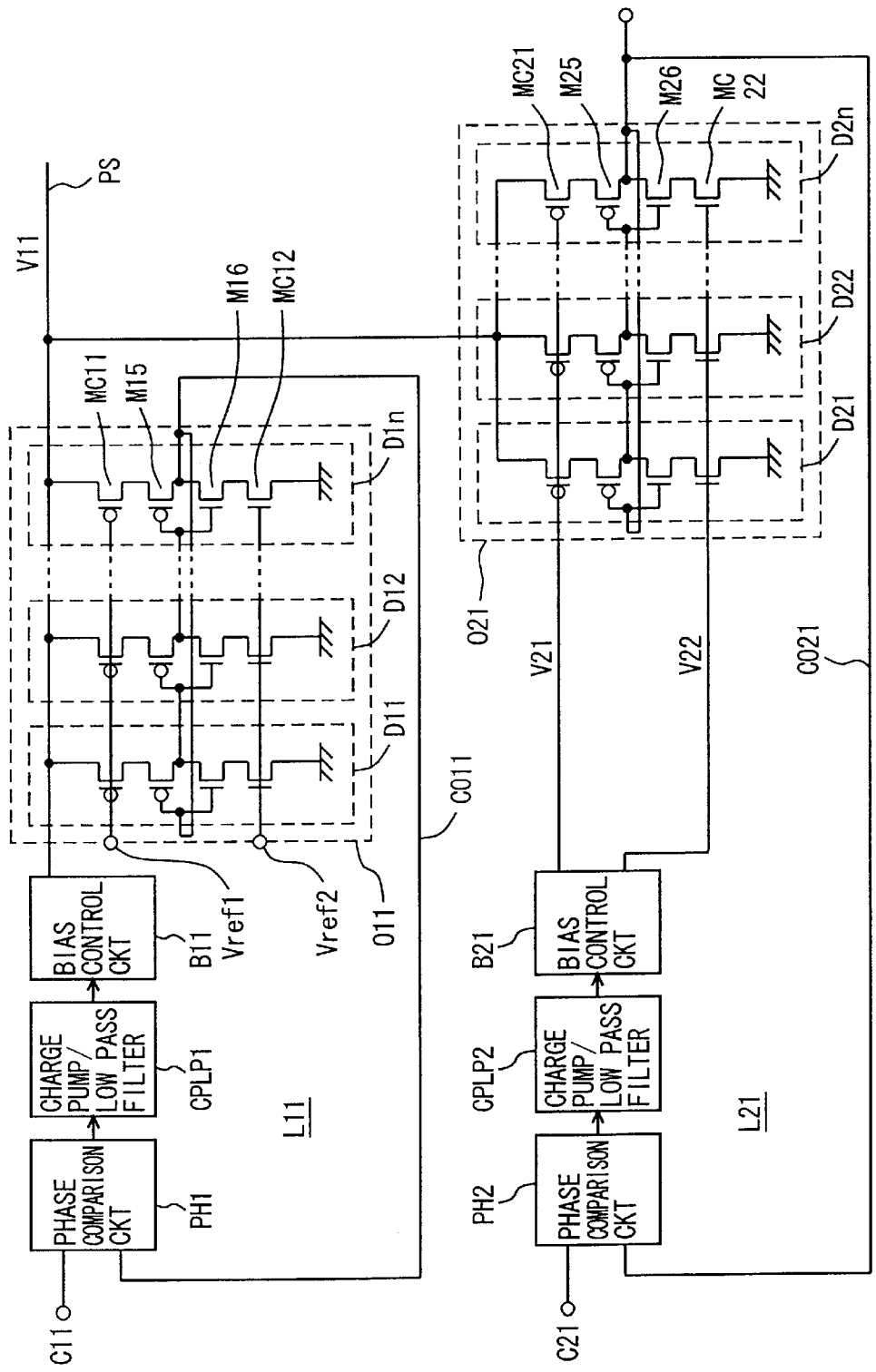
FIG. 1 is an example of the configuration of a clock generator according to a first embodiment of the present invention.

FIG. 1 is an example of the configuration of a clock generator according to a first embodiment of the present invention. Referring to FIG. 1, the clock generator includes a first phase-locked loop L11 and a second phase-locked loop L21 that are identical in operation characteristics to each other. That is, first phase-locked loop L11 is a replica circuit of second phase-locked loop L21, and is configured of components the same in size, for example, as components of the second phase-locked loop L21, and the operational characteristics thereof are set identical to those of second phase-locked loop L21. These first and second phase-locked loops L11 and L21 are formed through the same manufacturing steps. Hence, first and second phase-locked loops L11 and L21 are subject to the same influence of variations in transistor parameters in the manufacturing steps. Accordingly, the operation characteristics of phase-locked loops L11 and L21 vary in the same fashion from the designed characteristics because of variations in the transistor parameters.

First phase-locked loop L11 may be configured through proportional scale down of the components of second phase-locked loop L21. In this case as well, first and second phase-locked loops L11 and L21 are manufactured in the same steps, and the operation characteristics thereof are therefore the same with each other. Even in this case, a variation in a manufacturing step is appears in operation parameters of first and second phase-locked loops L11 and L21 similarly.

First phase-locked loop L11 includes: phase comparison circuit PH1 for comparing the phases of a first reference clock signal C11 such as a system clock signal and a dummy reproduced clock signal CO1; charge pump/low pass filter CPLP1 for performing charge-pumping and integration to generate a control voltage in response to a phase difference detection signal received from phase comparison circuit PH1; bias control circuit B11 for transferring a bias voltage (control power supply voltage) V11 to a power supply line PS according to the control voltage produced by charge pump/low pass filter CPLP1; and a voltage controlled oscillation circuit O11 receiving control power supply voltage V11 from power supply line PS as one operation power supply voltage, to perform self-running oscillation operation.

Voltage controlled oscillation circuit O11 includes an odd number of stages of delay cells D11 to D1n coupled in a ring form. Delay cells D11 to D1n each have an identical configuration, and therefore, in FIG. 1, reference characters are allotted to components of only delay cell Din at the final stage.

Delay cell D1n includes: a current source transistor MC11 formed of a p-MOS transistor and having a source coupled to power supply line PS, and a gage receiving a reference voltage Vref1; an MOS transistor M15 coupled between current source transistor MC11 and an output node, and having a gate receiving an output signal of the delay cell (D1(n−1)) at a preceding stage; an MOS transistor M16 having a drain coupled to the output node, and a gate receiving the output signal of the delay cell at the preceding state; and a current source transistors MC12 formed of an nMOS transistor and coupled between a ground node and n-MOS transistor M16, and having a gate receiving a reference voltage Vref2.

In each of delay cells D11 to D1n, reference voltage Vref1 is supplied to the gate of current source transistor MC11, and reference voltage Vref2 is supplied to the gate of current source transistor MC12. Reference voltages Vref1 and Vref2 each have a predetermined voltage level. Operation currents of delay cells D11 to D1n vary according to a potential level of power supply line PS and a control power supply voltage V11. The voltage level of the control power supply voltage V11 and the amount of current on power supply line PS are adjusted by bias control circuit B11 in accordance with the control voltage received from charge pump/low pass filter CPLP.

Second phase-locked loop L21 includes: a phase comparison circuit PH2 for comparing the phases of a second reference clock signal C21, which is a transmission clock signal included in a transmission data train for example, and a recovered clock signal CO21, for generating a phase difference detection signal in accordance with a result of detection; a charge pump/low pass filter CPLP2 performing a charge pump operation and integration for generating a control voltage in response to the phase difference detection signal received from phase comparison circuit PH2; a bias control circuit B21 for generating bias voltages V21 and V22 according to the control voltage produced by charge pump/low pass filter CPLP2; and a voltage controlled oscillation circuit O21 receiving control power supply voltage V11 as one operation power supply voltage to operate and having the operation current adjusted according to bias voltages V21 and V22 received from bias control circuit B21.

Voltage controlled oscillation circuit O21 includes an odd number of stages of delay cells D21 to D2n coupled in a ring form. Delay cells D21 to D2n each have an identical configuration, and therefore, in FIG. 1, reference characters are allotted only to components of delay cell D2n at the final stage.

Delay cell D2n includes: a current source transistor MC21 formed of a p-MOS transistor, and having a source coupled to power supply line PS and a gate receiving a bias voltage V21; an MOS transistor M25 coupled between current source transistor MC21 and an output node, and having a gate receiving an output signal of the delay cell at a preceding stage; an MOS transistor M26 having a drain coupled to the output node, and a gate receiving the output signal of delay cell (D2(n−1)) at the preceding stage; and a current source transistor MC22 formed of an n-MOS transistor, coupled between a ground node and MOS transistor M26, and having a gate receiving a bias voltage V22.

Recovered clock signal CO21 is generated from delay cell D2n at the final stage, and is fed back to phase comparison circuit PH2. In second phase-locked loop L21, voltage controlled oscillation circuit O21 has the oscillation frequency adjusted by bias voltages V21 and V22 in accordance with a phase difference between recovered clock signal CO21 and input clock signal C21, and in addition, has the frequency characteristics adjusted by control power supply voltage V11 supplied through power supply line PS.

Figure 2A:
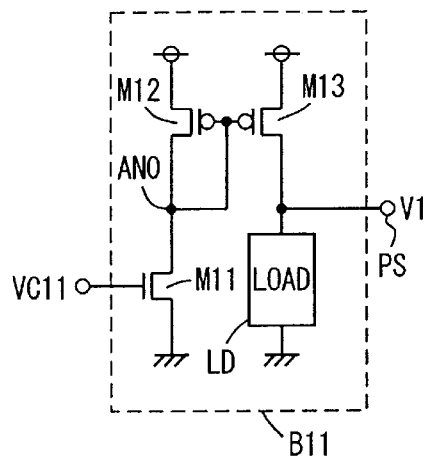
FIGS. 2A and 2B each shows an example of the configuration of a bias control circuit shown in FIG. 1.

FIG. 2A shows a configuration of bias control circuit B11 shown in FIG. 1. Referring to FIG. 2A, bias control circuit B11 includes: a p-MOS transistor M12 coupled between a power supply node and a node AN0, and having a gate coupled to node AN0; an n-MOS transistor M11 coupled between node AN0 and a ground node, and having a gate receiving a control voltage VC11 from charge pump/low pass filter CPLP1 shown in FIG. 1; a p-MOS transistor M13 for supplying a current to the power supply line PS from the power supply node, in response to the voltage of node AN0, to generate the control power supply voltage; and a load element LD coupled between p-MOS transistor M13 and a ground node. The load element LD may be configured to have a current/voltage conversion function and may have a function for stabilizing control power supply voltage V11 of power supply line PS.

In bias control circuit B11 shown in FIG. 2A, when the level of control voltage VC11 rises, the conductance of MOS transistor M11 increases, and the current flowing through MOS transistor M12 also increases. MOS transistors M12 and M13 form a current mirror. Hence, the current transferred from MOS transistor M13 to power supply line PS is also increased, thereby causing the level of control power supply voltage V11 to increase. The gate of MOS transistor M13 is coupled to node AN0, in which when the level of control voltage VC11 rises, the voltage level of node AN0 drops, and the conductance of MOS transistor M13 increases accordingly.

With load element LD including the voltage-stabilizing function, the conductance (channel resistance) of MOS transistor M13 works to generate control power supply voltage V11 on power supply line PS. With load element LD including the current/voltage conversion function, control power supply voltage V11 is generated and transferred to power supply line PS according to the supply current from MOS transistor M13. In voltage controlled oscillation circuit O11, operation current and power supply voltage are adjusted corresponding to a phase difference of clock signals C11 and CO11.

Figure 2B:
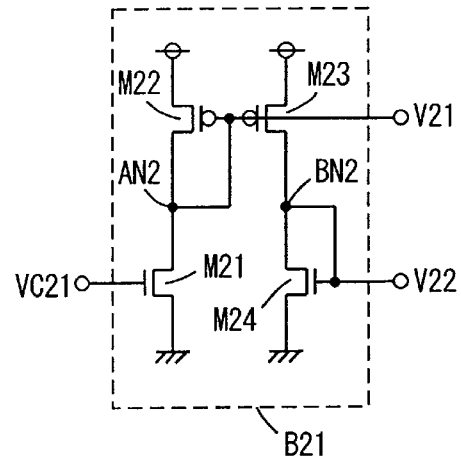

FIG. 2B shows a configuration of bias control circuit B21 included in second phase-locked loop L21 (shown in FIG. 1). In FIG. 2B, bias control circuit B21 includes: a p-MOS transistor M22 coupled between a power supply node and a node AN2, and having a gate coupled to node AN2; an nMOS transistor M21 coupled between node AN2 and a ground node, and receiving, at a gate thereof, a control voltage VC21 from charge pump/low pass filter CPLP2 shown in FIG. 1; a p-MOS transistor M23 coupled between the power supply node and a node BN2, and having a gate coupled to node AN2; and an n-MOS transistor M24 coupled between node BN2 and a ground node, and having a gate coupled to node BN2. Bias voltage V21 is generated at node AN2, and bias voltage V22 is generated at node BN2.

Bias control circuit B21 shown in FIG. 2B is similar in configuration to the conventional bias control circuit, and the levels of bias voltages V21 and V22 are adjusted in accordance with the level of control voltage VC21. Bias voltage V21 is set to a voltage level at which currents flowing through MOS transistors M21 and M22 are balanced with each other. Bias voltage V22 is set to a voltage level at which the currents flowing through MOS transistors M23 and M24 are balanced with each other.

Figure 3:
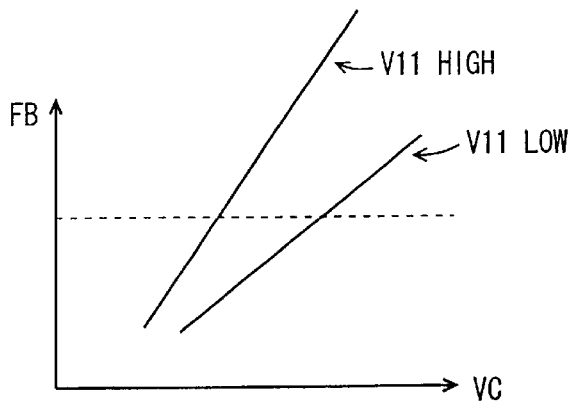
FIG. 3 shows frequency characteristics of the clock generator shown in FIG. 1.

FIG. 3 schematically shows the relationship between the operation power supply voltage and the control voltage of voltage controlled oscillation circuit O21. Generally, an MOS transistor (insulated gate type field effect transistor) has an operation speed increased as the gate to source voltage thereof is increased. In voltage controlled oscillation circuit O21, when the level of the operation power supply voltage, or control power supply voltage V11 is high, the oscillation frequency varies greatly according to the variation in control voltage VC. However, when the level of the operation power supply voltage, or control power supply voltage V11 is low, the oscillation frequency varies at a low rate according to the variation in control voltage VC.

More specifically, when control power supply voltage V11 is increased in voltage level, the frequency gain (rate of the variation in the oscillation frequency to the variation in the bias voltage to) increases, and control power supply voltage V11 decreases in voltage level, the frequency gain of voltage controlled oscillation circuit O21 decreases. Hence, the frequency gain of voltage controlled oscillation circuit O21 is adjusted in accordance with the oscillation condition of first phase-locked loop L11, to cause the VCO characteristics of voltage controlled oscillation circuit O21 to coincide with the VCO characteristics of first voltage controlled oscillation circuit O11.

Phase comparison circuits PH1 and PH2 have the same configuration. Also, charge pump/low pass filters CPLP1 and CPLP2 have the same configuration.

For first phase-locked loop L11, voltage controlled oscillation circuit O11 is optimally designed such that recovered clock signal CO11 and first reference clock signal C11 oscillate at the same frequency and at the same central frequency under the condition of a predetermined power supply voltage level and predetermined levels of reference voltages Vref1 and Vref2. Reference voltages Vref1 and Vref2 are equivalent to the bias voltage corresponding to the middle value of a control voltage VC in the stage of the optimal design.

First reference clock signal C11 is, for example, a system clock signal. According to control voltage VC11 supplied from charge pump/low pass filter CPLP1, bias control circuit B11 generates control power supply voltage V11. Voltage controlled oscillation circuit O11 has the operation speed varying according to the level of the control power supply voltage V11, and has the frequency gain varying accordingly (refer to FIG. 3).

Specifically, when control voltage VC11 is increased, the conductance of MOS transistor M13 in bias control circuit B11 shown in FIG. 2A increases, the current supplied to power supply line PS also increases to raise the level of control power supply voltage V11, resulting in an increased oscillation speed of voltage controlled oscillation circuit O11. On the other hand, when first reference clock signal C11 is low, the conductance of MOS transistor M13 shown in FIG. 2A is low to supply a small amount of current. The level of control power supply voltage V11 lowers, and the operation speed of voltage controlled oscillation circuit O11 decreases accordingly.

With control power supply voltage V11 being used as a virtual power supply voltage, the operation speed of voltage controlled oscillation circuit O11 is adjusted, or delay times of delay cells D11 to D1n are adjusted. Responsively, the oscillation frequency of voltage controlled oscillation circuit O11 is adjusted, and the phases of recovered clock signal CO11 and first reference clock signal C11 are synchronized in phase to each other, and coincide in frequency with each other.

First phase-locked loop L11 has the frequency range determined with the frequency of first reference clock signal being the central frequency in a phase-locked state, because first reference clock signal C11 is a system clock signal, for example, and has the frequency thereof predetermined. In addition, voltage controlled oscillation circuit O11 of first phase-locked loop L11 has the frequency characteristics adjusted to oscillate at the central frequency, after the phase lock is established.

Figure 4:
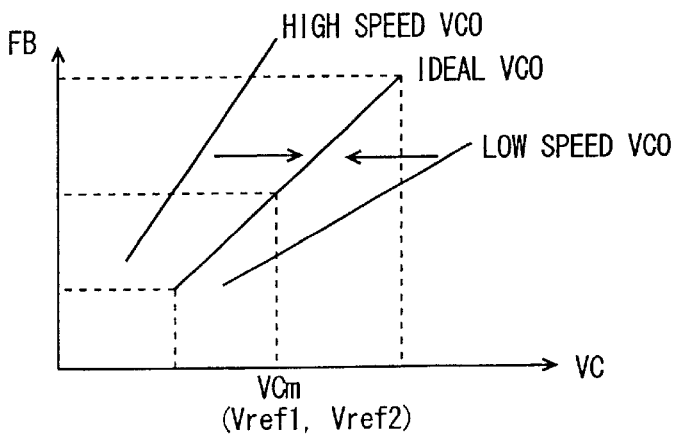
FIG. 4 shows frequency characteristic compensation in the clock generator shown in FIG. 1.

More specifically, referring to FIG. 4, when first phase-locked loop L11 has high-speed VCO characteristics due to a variation in transistor parameter caused in a manufacturing step, control power supply voltage V11 is adjusted to reduce the frequency gain, for achieving the ideal VCO characteristics. When voltage controlled oscillation circuit O11 has low-speed VCO characteristics, the operation speed thereof is increased to raise the frequency gain through the control power supply voltage V11. Thereby, voltage controlled oscillation circuit O11 is set to have the ideal VCO characteristics. Therefore, through the adjustment of the level of control power supply voltage V11, voltage controlled oscillation circuit O11 has ideal VCO characteristics, and therefore oscillates at the central frequency in the phase-locked state.

In second phase-locked loop L21, control power supply voltage V11 is supplied from power supply line PS to voltage controlled oscillation circuit L21 as an operation power supply voltage. The operation power supply voltage (control power supply voltage) V11 is generated by the channel resistance of MOS transistor M13 in bias control circuit B11, as shown in FIG. 2A.

In second phase-locked loop L21, bias control circuit B21 generates bias voltages V21 and V22 corresponding to a phase difference of second reference clock signal C21 such as a data clock signal and recovered clock signal CO21. As shown in FIG. 2B, specifically, in bias control circuit B21, an ON-resistance value (channel resistance, or conductance) of MOS transistor M21 varies according to the level of control voltage VC21, and the amount of current flowing through MOS transistor M21 varies accordingly. The voltage level of node AN2 is stabilized at a voltage level at which the currents flowing through MOS transistors M22 and M21 are equalized to each other, and the voltage of node AN2 is supplied as bias voltage V21.

MOS transistor M23 supplies, to MOS transistor M24, a mirror current flowing through MOS transistor M22. In this case, when the currents flowing through MOS transistors M23 and M24 are equalized to each other, the voltage level of node BN2 is stabilized, and the voltage of node BN2 is supplied as bias voltage V22.

In voltage controlled oscillation circuit O21, the currents flowing through current source transistors MC21 and MC22 are adjusted according to bias voltages V21 and V22. Following the variations in the operation currents flowing through current source transistors MC21 and MC22, the operation speeds of delay cells D21 to D2n are varied, and the delay amounts (delay times) thereof are varied accordingly. According to the delay times of the delay cells D21 to D2n, the free-running oscillation cycle of voltage controlled oscillation circuit O21 varies.

Voltage controlled oscillation circuit O21 receives control power supply voltage V11 as an operation power supply voltage thereof. Since voltage controlled oscillators O11 and O21 have the same operation characteristics, when voltage controlled oscillation circuit O21 has high-speed VCO characteristics, the level of control power supply voltage V11 is lowered, and the frequency gain thereof is reduced. In contrast, when voltage controlled oscillation circuit O21 has low-speed VCO characteristics, the level of control power supply voltage V11 rises to increase the frequency gain of the voltage controlled oscillation circuit O21. Thus, voltage controlled oscillation circuit O21 has the same frequency gain as that of voltage controlled oscillation circuit O11.

The levels of bias voltages V21 and V22 are adjusted in accordance with a phase difference between recovered clock signal CO21 and second reference clock signal C21. When recovered clock signal CO21 and second reference clock signal C21 are phase-synchronized with each other, voltage controlled oscillation circuit O21 oscillates at the central frequency since second reference clock signal C21 is the same in frequency as first reference clock signal C11. Thus, the frequency of recovered clock signal CO21 can be set to the central frequency.

In the arrangement shown in FIG. 1, phase comparison circuits PH1 and PH2 may be configured to detect the coincidence in the phase and the frequency. In this arrangement, charge pump/low pass filter CPLP1 and charge pump/low pass filter CPLP2 each are configured to generate a control voltage according to the detection result.

First Modification of the First Embodiment:

As described above, with clock signals C11 and C21 having the same frequency, first and second voltage controlled oscillators O11 and O21 can oscillate substantially at the same central frequency. Hence, when clock signals having different frequencies are supplied in phase-locked loops L11 and L21, voltage controlled oscillators O11 and O21 need to be driven to oscillate at the same frequency, in order to cause voltage controlled oscillators O11 and O21 to oscillate at the same central frequency. In this case, the configurations thereof need to be modified according to the relationship between the frequencies of clock signals C11 and C21.

Figure 5:
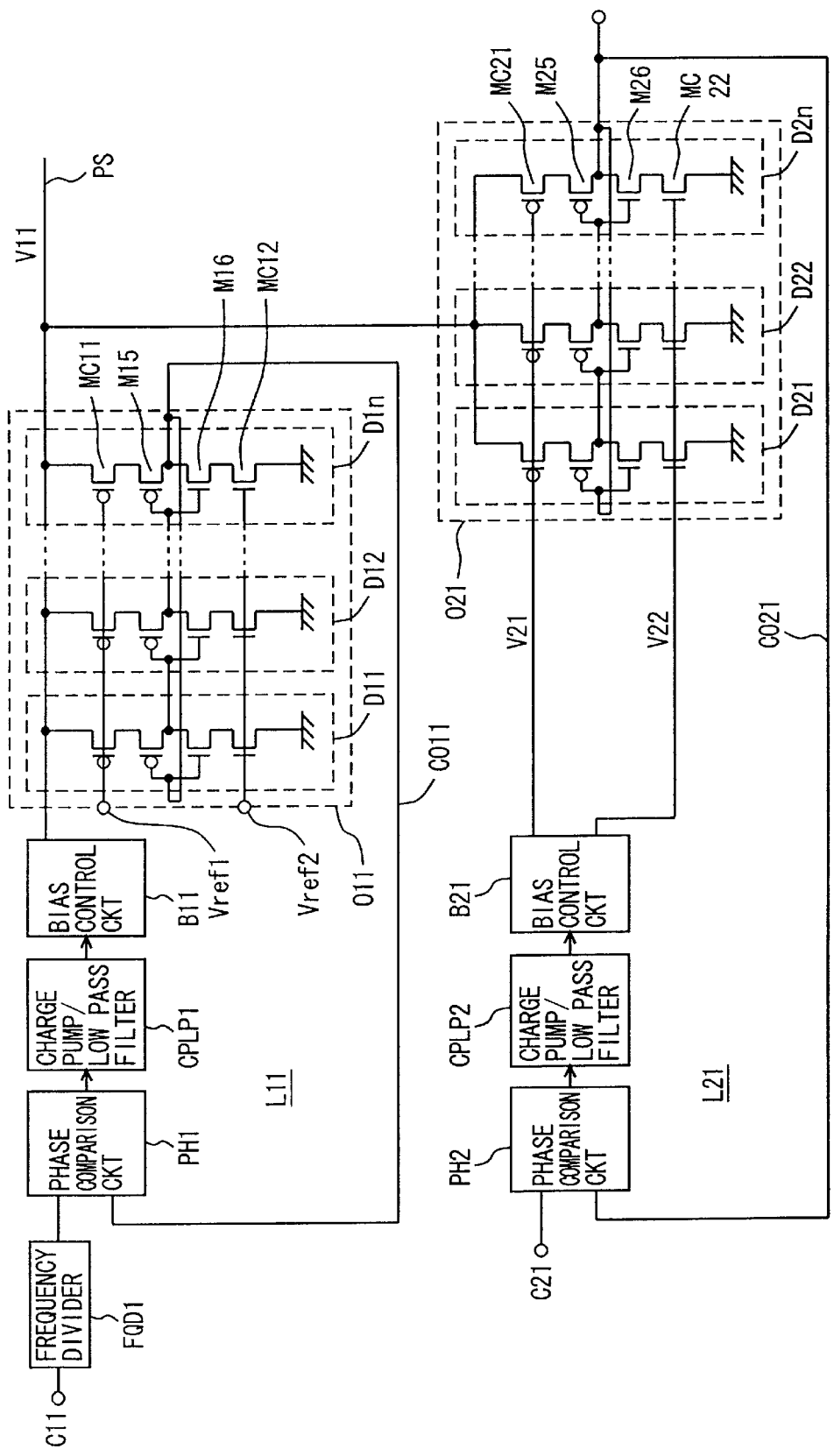
FIG. 5 shows a first modification of the clock generator according to the first embodiment.

FIG. 5 schematically shows a configuration of a first modification of the first embodiment according to the present invention. In the configuration shown in FIG. 5, a frequency-dividing circuit FQD1 for frequency-dividing clock signal C11 at a predetermined frequency-dividing ratio is provided in phase-locked loop L11. Frequency-divided clock signal produced from frequency-dividing circuit FQD1 is supplied to phase comparison circuit PH1. Other configurations are the same as those shown in FIG. 1. The same reference numerals/characters are used for the corresponding portions, and detailed descriptions thereof are omitted.

Clock signal C21 supplied to second phase-locked loop L21 has a frequency lower than that of reference clock signal C11. It is assumed that a frequency fc11 of reference clock signal C11 is K times a frequency fc21 of clock signal C21. That is, when fc11=K·fc21, the frequency division at a factor of K is made in frequency-dividing circuit FQD1, frequency-divided clock signal having a frequency of fc11/K is generated to be applied to phase comparison circuit PH1.

In such state, phase-locked loops L11 and L21 are allowed to oscillate in phase-synchronization with clock signals having the same frequency. With this arrangement, similarly to that shown in FIG. 1, by oscillating voltage controlled oscillation circuit O11 at the central frequency, voltage controlled oscillation circuit O21 can oscillate accurately at the central frequency.

Figure 6:
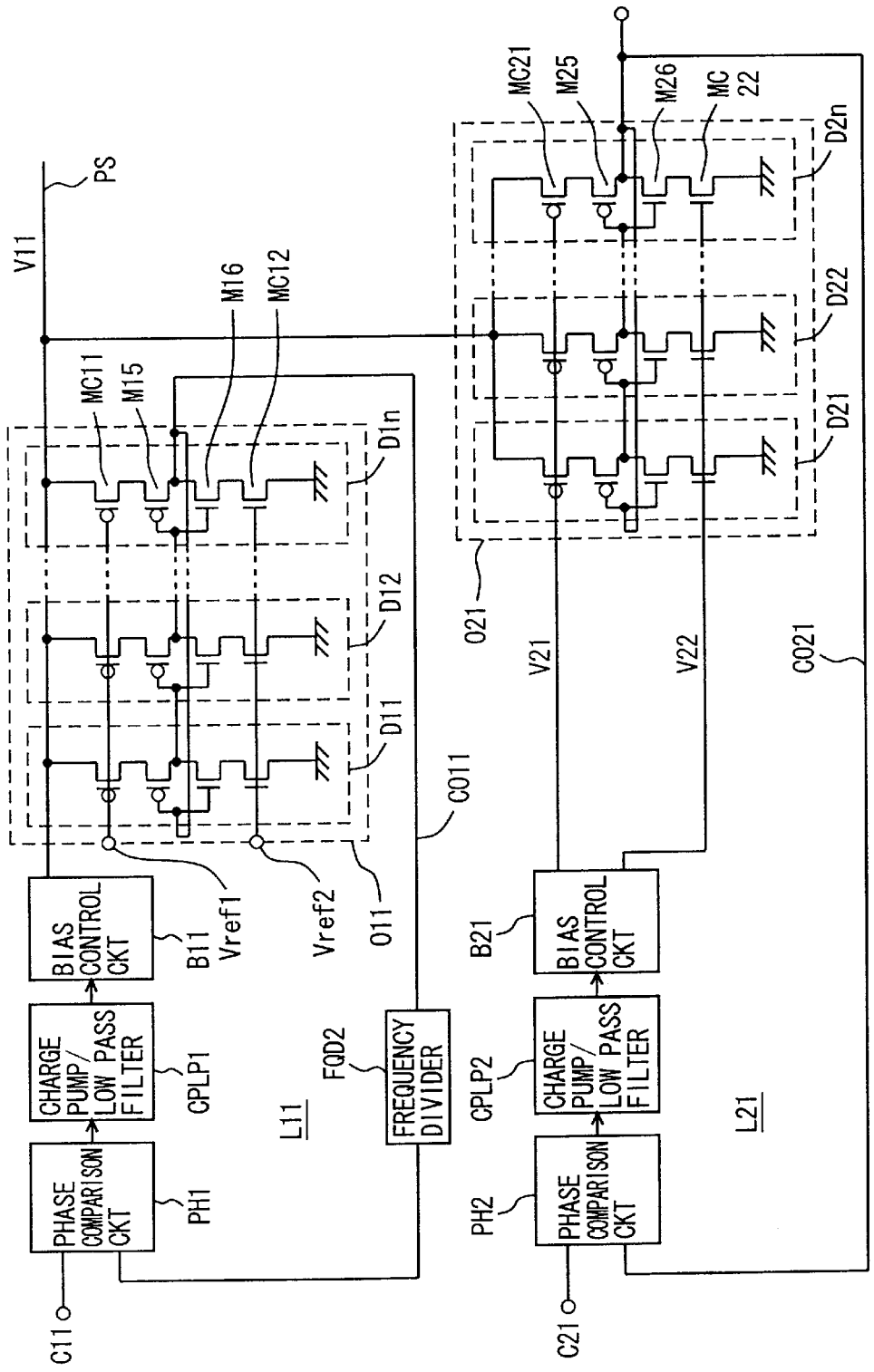
FIG. 6 shows a second modification of the clock generator according to the first embodiment.

Second Modification of the First Embodiment:

FIG. 6 schematically shows a configuration of a second modification of the first embodiment according to the present invention. In the configuration shown in FIG. 6, first phase-locked loop L11 is provided with a frequency-dividing circuit FQD2 for frequency-dividing, at a predetermined frequency-dividing ratio, an oscillation signal (recovered clock signal) CO11 produced by voltage controlled oscillation circuit O11. Frequency-divided clock signal produced from frequency-dividing circuit FQD2 is applied to phase comparison circuit PH1.

Frequency fc11 of first reference clock signal C11 is lower than a frequency fc21 of second reference clock signal C21. When the relationship of fc11=fc21/K hods, frequency-dividing circuit FQD2 performs the frequency dividing operation at a frequency-dividing ratio of K. Phase comparison circuit PH1 produces a signal according to the phase-comparison result so as to equalize the phases and frequencies of first reference clock signal C11 and the frequency-divided clock signal produced by frequency-dividing circuit FQD2. In this way, in the phase-locked state in first phase-locked loop L11, voltage controlled oscillation circuit O11 oscillates at K times the frequency of first reference clock signal C11. Oscillation frequency of first reference clock signal C11 is the same as that of reference clock signal C21 supplied to second phase-locked loop L21. Thus, first and second voltage controlled oscillators O11 and O21 can be made to oscillate at the same frequency, and voltage controlled oscillation circuit O21 can be made to oscillate at the central frequency, similarly to the configuration as shown in FIG. 1.

The frequency-dividing circuit is provided in the configurations as shown in FIGS. 5 and 6 for the following reason. When a high-speed clock signal is applied, it is difficult to generate a frequency-multiplied signal for such a high-speed clock signal. However, if there is a capacity for performing frequency multiplication for the clock signal, a circuit for frequency division as well as frequency multiplication may be provided in place of the frequency-dividing circuit. With such configuration, a single circuit can accommodate for a high-frequency clock signal and a low-frequency clock signal only through a modification of the frequency-dividing ratio (including the case of frequency multiplication) without modifying the circuit configuration.

Furthermore, by making variable the frequency-dividing ratio of each of frequency-dividing circuits FQD1 and FQD2, the second reference clock signal of different frequencies can be adapted.

Figure 7:
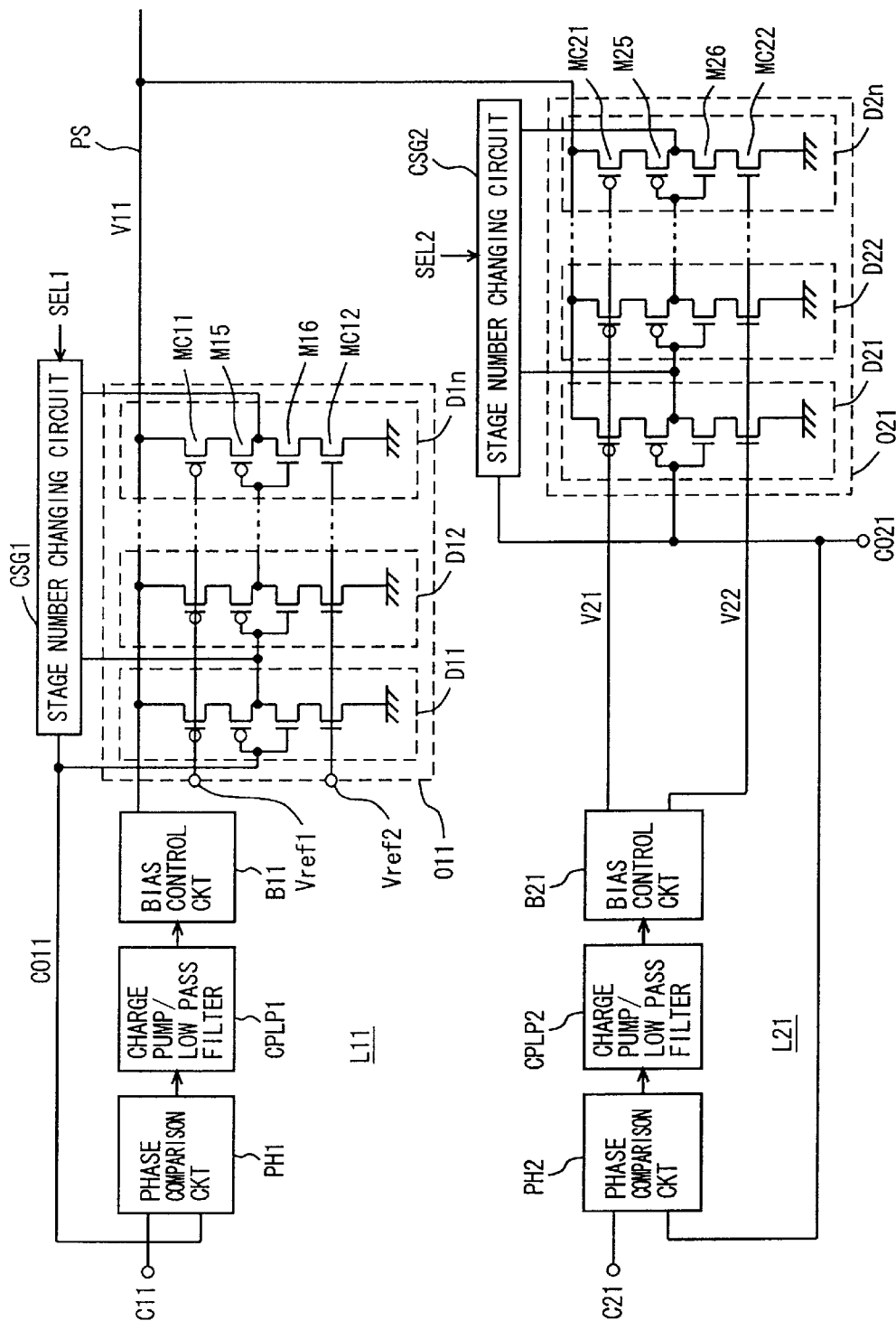
FIG. 7 shows a third modification of the clock generator according to the first embodiment.

Third Modification of the First Embodiment:

FIG. 7 schematically shows configuration of a third modification of the first embodiment according to the present invention. In the configuration shown in FIG. 7, first phase-locked loop L11 includes a stage number changing circuit CSG1 for changing the number of delay stages of voltage controlled oscillation circuit O11 in accordance with a selection signal SEL1. Second phase-locked loop L21 includes a stage number changing circuit CSG2 that changes the number of delay stages of second voltage controlled oscillation circuit O21 in response to a selection signal SEL2.

In response to selection signal SEL1, stage number changing circuit CSG1 selects an output signal of the odd number stage of a delay cell of delay cells D11 to D1n in voltage controlled oscillation circuit O11, and feeds back the selected signal to the first stage delay cell D11 as well as to phase comparison circuit PH1.

Similarly, in response to selection signal SEL2, stage number changing circuit CSG2 selects an output signal of a delay cell at an odd number stage in delay cells D21 to D2n in voltage controlled oscillation circuit O21, and feeds back the selected signal to the first stage delay cell D21 as well as to phase comparison circuit PH2.

These stage number changing circuits CSG1 and CSG2 are used to change the oscillation frequencies of the respective voltage controlled oscillators O11 and O21. The operational characteristics of voltage controlled oscillators O11 and O21 are substantially the same. For example, if the number of delay stages of voltage controlled oscillation circuit O11 is twice the number of delay stages of second voltage controlled oscillation circuit O21, the oscillation frequency of first voltage controlled oscillation circuit O11 becomes ½ times the oscillation frequency of second voltage controlled oscillation circuit O21. When the ratio of frequencies of reference clock signals C11 and C21 is 1:2, voltage controlled oscillation circuits O11 and O21 can be controlled to oscillate at the frequencies of corresponding reference clock signals C11 and C21. In this case, the power supply control voltage is adjusted to cause voltage controlled oscillation circuit O11 to oscillate accurately at the frequency of first reference clock signal. Thereby, second voltage controlled oscillation circuit O21 can be controlled to oscillate at the central frequency.

Therefore, even when frequencies of reference clock signals C11 and C21 are different from each other, second voltage controlled oscillation circuit O21 can be controlled to oscillate accurately at the central frequency through the following operation control. Voltage controlled oscillators O11 and O21 are tuned to oscillate at the frequencies of the corresponding reference clock signals, and the oscillation characteristics of second voltage controlled oscillation circuit O21 are adjusted according to the control of the power supply control voltage of first voltage controlled oscillation circuit O11.

With the above-described configuration of the frequency change, second voltage controlled oscillation circuit O21 is allowed to oscillate substantially at the central frequency, in the case that phase-locked loops L11 and L21 have the same operation characteristics.

Even if the operation characteristics of first and second phase-locked loops L11 and L21 deviate from each other, the second voltage controlled oscillation circuit O21 can be made to oscillate at the central frequency when first and second reference clock signals C11 and C21 are the same in frequency. More specifically, in first phase-locked loop L11, the power supply control voltage of first voltage controlled oscillation circuit O11 is adjusted equalize the oscillation frequency thereof with that of first reference clock signal C11. The operation power supply voltage of the second voltage controlled oscillation circuit O21 is controlled to perform the oscillation at the frequency of the first reference clock signal C11, or the frequency of the second reference clock signal C21. Thus, the second voltage controlled oscillation circuit C21 can have the oscillation frequency set at the central frequency, for tracking the frequency of the second reference clock signal C21.

When the frequencies of first and second reference clock signals C1 and C21 are different from each other, voltage controlled oscillation circuit O11 can have the power supply voltage controlled so as to phase-synchronize with first reference clock signal C11. Hence, even when a transistor parameter is varied in a manufacturing step, such a variation can be compensated for through adjustment of the power supply voltage of voltage controlled oscillation circuit O11. Since the frequency of second reference clock signal C21 is different from that of first reference clock signal C11, second voltage controlled oscillation circuit O21 is not locked at the central frequency. However, the variation in transistor parameter can be compensated for through adjustment of the power supply voltage, and therefore, second voltage controlled oscillation circuit O21 can track the frequency of second reference clock signal C21. In particular, when second voltage controlled oscillation circuit O21 is a "highly sensitive" oscillator that causes a small change in frequency for the variation in the control voltage, second voltage controlled oscillation circuit O21 can be controlled to perform frequency-tracking so that second voltage controlled oscillation circuit O21 can be locked at the center value of the voltage range, or the central frequency under the state that second voltage controlled oscillation circuit O21 has the operation power supply voltage adjusted so as to oscillate at the center frequency by the first phase-locked loop L1.

As described above, according to the first embodiment, the following configuration is provided: the first and second phase-locked loops having the same operation characteristics are disposed; a control power supply voltage is generated to oscillate the first phase-locked loop at the central value of the frequency range for the first reference clock signal such as a system clock, to adjust the power supply voltage of the first voltage controlled oscillation circuit; and the control power supply voltage is used as the operation power supply power supply voltage of the second voltage controlled oscillation circuit in the second phase-locked loop. According to this configuration, after completion of the manufacturing steps, the deviation in the oscillation frequency of the clock generating circuit from the central frequency can be compensated for through the adjustment of the frequency gain by the control of power supply voltage. Accordingly, the second phase-locked loop has the frequency characteristics corrected to oscillate at the central value of the control voltage, and can track the frequency of the input clock signal to oscillate at the center frequency.

When the frequencies of the reference clock signals are different, oscillation frequencies of the first and second voltage controlled oscillation circuits are adjusted according to the reference clock signals. In this way, the oscillation circuits can be controlled to oscillate accurately at the central frequency even when the reference clock signals are different in frequency from each other.

Even when the first and second reference clock signals are different in frequency from each other, the second phase-locked loop adjusts the oscillation frequency to set the second reference clock signal to the center frequency and oscillates, to stably produce a phase-synchronized, recovered clock signal. In particular, for a recovered clock producing section in a clock/data reproducing circuitry in which input clock signals can have different phases and frequencies with respect to a system clock signal, oscillation can be established for each respective input clock signal through frequency correction from the center frequency, and therefore, a recovered clock signal synchronized in phase with each input clock signal can be produced.

The voltage controlled oscillation circuit can oscillate with the designed center frequency being the center frequency, even when the frequency characteristics thereof vary after completion of the manufacturing steps. Thereby, pulling-in operation can be stably performed for each input clock signal of a different frequency to generate a recovered clock signal.

Meanwhile, MOS transistor M13 included in bias control circuit B11 for generating control power supply voltage V11 is made to have the amount of the supplying current as large as possible, because MOS transistor M13 is required to supply operation currents to first and second voltage controlled oscillation circuits O11 and O21.

[Second Embodiment]

Figure 8:
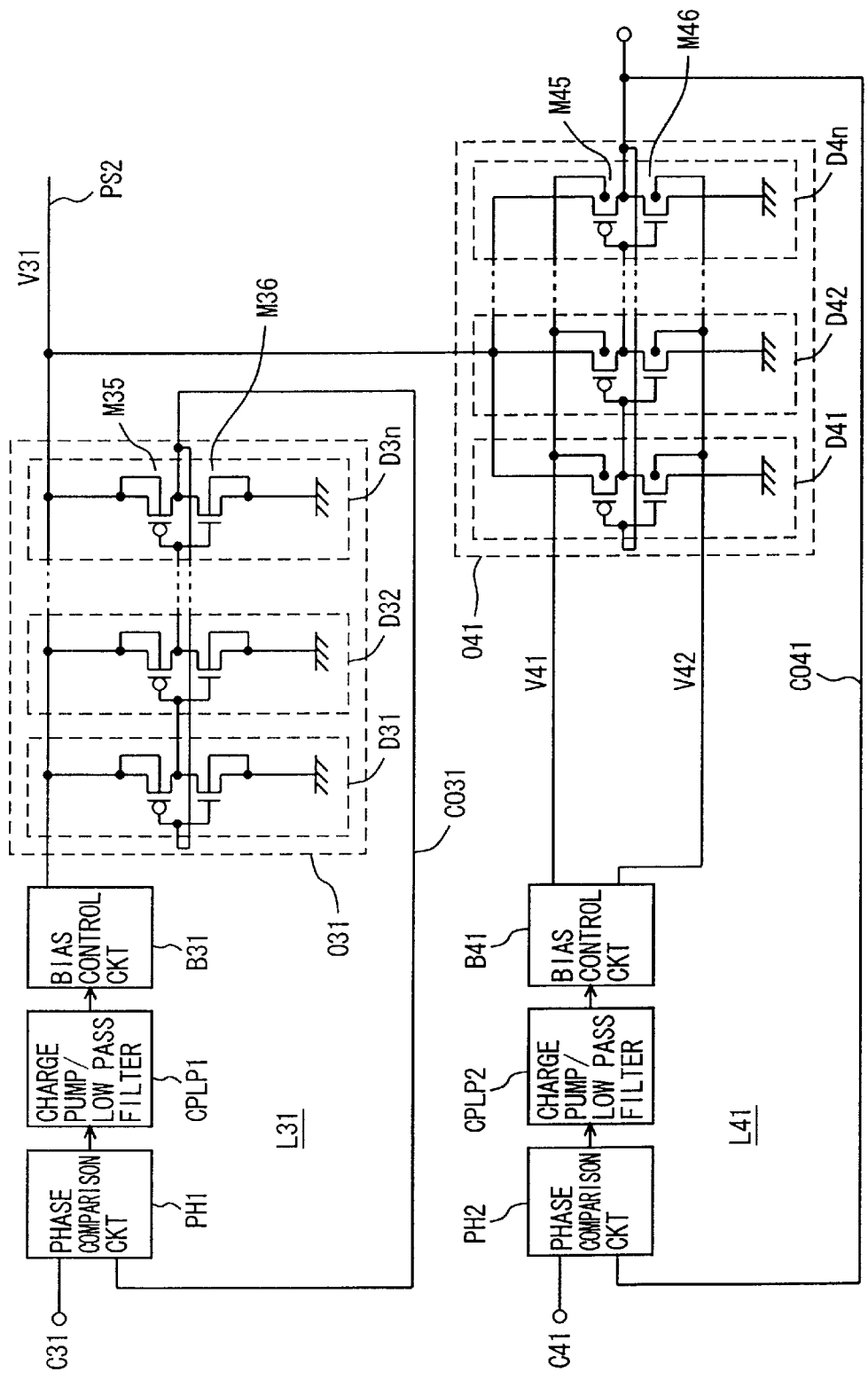
FIG. 8 shows a configuration of a clock generator according to a second embodiment of the present invention.

FIG. 8 schematically shows a configuration of a clock generator according to a second embodiment of the present invention. Similarly to the first embodiment, the clock generator shown in FIG. 8 includes a first phase-locked loop L31 for generating a dummy clock signal CO31 phase-synchronized with a reference clock signal C31, and a second phase-locked loop L41 having the VCO characteristics (frequency gain) adjusted according to a control power supply voltage V31 from first phase-locked loop L31.

Similarly to the first embodiment, first phase-locked loop L31 includes: a phase comparison circuit PH1 for comparing the phase of a first reference clock signal C31 and a recovered clock signal CO31; a charge pump/low pass filter CPLP1 for generating a control voltage VC in accordance with an output signal produced from phase comparison circuit PH1; a bias control circuit B31 for generating a control power supply voltage V31 onto a power supply line PS2 in accordance with an output signal from charge pump/low pass filter CPLP1; and a voltage controlled oscillation circuit (ring oscillator) O31 receiving bias voltage V31 as an operation power supply voltage for performing a free running oscillation.

Voltage controlled oscillation circuit O31 includes an odd-number of stages of delay cells D31 to D3n coupled in a ring form. Delay cells D31 to D3n each have an identical configuration and therefore, in FIG. 1, reference characters are allotted to components of only the final-stage delay cell D3n.

Delay cell D3n includes a p-MOS transistor M35 for transferring control power supply voltage V31 on a power supply line PS22 to an internal output node, and an n-MOS transistor M36 rendered conductive, in response to an output signal produced by the preceding-stage delay cell, for discharging the internal output node to the ground potential level. In other words, each of delay cells D31 to D3n is formed of a CMOS inverter, and has the operation power supply voltage and the operation current adjusted through control power supply voltage V31 on power supply line PS2.

Bias control circuit B31 has a configuration similar to that of bias control circuit B11 of the first embodiment shown in FIG. 2A, and transfers the operation current/voltage to power supply line PS2 through the p-MOS transistor in the output section in accordance with the control voltage received from charge pump/low pass filter CPLP. In first phase-locked loop L31, the voltage controlled oscillation circuit is optimumly designed to perform the free running oscillation at the center frequency of the frequency range when the reference clock signal C31 such as a system clock signal and the dummy recovered clock signal CO31 are phase-synchronized with each other under a condition of a predetermined power supply voltage level.

Configurations of phase comparison circuit PH1 and charge pump/low pass filter CPLP1 are similar to those of the first embodiment shown in FIG. 1.

As in the first embodiment shown in FIG. 1, second phase-locked loop L41 includes: a phase comparison circuit PH2 for detecting a phase difference between a recovered clock signal CO41 and an input clock signal C41; a charge pump/low pass filter CPLP2 performing a charge pumping operation and integration in accordance with an output signal from phase comparison circuit PH2; a bias control circuit B41 for generating bias voltages V41 and V42 according to the control voltage produced by charge pump/low pass filter CPLP2, and a voltage controlled oscillation circuit O41 receiving bias voltage V31 as an operation power supply voltage, and having an operation current thereof adjusted according to bias voltages V41 and V42.

Phase comparison circuit PH2 and charge pump/low pass filter CPLP2 have configurations similar to the respective configurations of phase comparison circuit PH1 and charge pump/low pass filter CPLP1. In addition, bias control circuit B41 has a configuration similar to that of bias control circuit B21 according to the first embodiment shown in FIG. 2B. Bias control circuit B41 generates a current according to the control voltage received from charge pump/low pass filter CPLP2, and converts the generated current into voltages, thereby generating bias voltages V41 and V42.

Voltage controlled oscillation circuit O41 includes odd-number stages of delay cells D41 to D4n coupled in a ring form. Delay cells D41 to D4n each have an identical configuration and therefore, in FIG. 8, reference characters are allotted to components of only the delay cell D4n at a final stage. Delay cell D4n includes a p-MOS transistor M45 selectively rendered conductive, in response to an output signal produced by the delay cell at a preceding stage, for transferring control power supply voltage V31 on power supply line PS2 to an internal output node and an n-MOS transistor M46 selectively rendered conductive, in response to an output signal produced by the delay cell at the preceding stage, for discharging the internal output node to the ground potential level. The back gate of p-MOS transistor M45 receives bias voltage V41, and the back gate of n-MOS transistor M46 receives bias voltage V42.

Voltage controlled oscillators O31 and O41 are so optimized in the designing stage in advance as to oscillate at the central frequency under the condition of the same power supply voltage and the same back gate bias. In each of delay cells D31 to D3n of voltage controlled oscillation circuit O31, the back gates of MOS transistors M35 and M36 are coupled to the corresponding sources, to suppress the substrate effect.

In second phase-locked loop L41, the back gate voltages of MOS transistors M45 and M46 are adjusted according to the respective bias voltages V41 and V42, and the absolute values of the threshold voltages are adjusted. Through the adjustment for the threshold voltages, the conductances of MOS transistors M45 and M46 are varied even under the condition of the same gate voltage. Accordingly, the operation currents are varied, and the delay times of delay cells D41 to D4n are varied.

In the above-described configuration, in voltage controlled oscillation circuit O41, the MOS transistors of the delay cells have the substrate voltages adjusted. On the other hand, in the first voltage controlled oscillation circuit O31, the substrate effects of the MOS transistors of the delay cells are suppressed. Although the operation characteristics of voltage controlled oscillators O31 and O41 are different from each other, voltage controlled oscillation circuit O41 can be controlled to accurately track the frequency of second reference clock signal through adjustment of the control power supply voltage of the first voltage controlled oscillation circuit so as to cause the second voltage controlled oscillation circuit to oscillate at the center frequency or the middle value of the frequency range both when the reference clock signals C31 and C41 are the same in frequency and when they are different in frequency because the second voltage controlled oscillation circuit is a "high sensitive" circuit.

In an event the oscillation frequency of voltage controlled oscillation circuit O41 is adjusted by controlling the back gate bias, even when the control voltages or bias voltages V41 and V42 vary to a great extent, the change amount of the threshold voltage is small. Therefore, the frequency gain with respect to the control voltage of second voltage controlled oscillation circuit O41 is small, as compared to that of first voltage controlled oscillation circuit O31.

In first phase-locked loop L31, the phase/frequency of dummy recovered clock signal CO31 is adjusted in response to reference clock signal C31 that has a constant cycle. In the adjustment operation, control power supply voltage V31 is varied in accordance with a phase difference between reference clocks signal C31 and dummy recovered clock signal CO31.

In such a case, as in bias control circuit B11 shown in FIG. 2A, when the control voltage from charge pump/low pass filter CPLP1 increases, the output current of bias control circuit B31 increases, and accordingly, the voltage level of control power supply voltage V31 rises. Therefore, in voltage controlled oscillation circuit O31, the drive currents of delay cells D31 to D3n increase, and the amounts of delays thereof are reduced accordingly, and the oscillation frequency increases. Conversely, when the amount of the drive current of bias control circuit B31 is reduced, and the voltage level of control power supply voltage V31 is lowers, the amounts of the drive currents of delay cells D31 to D3n are reduced and accordingly, the amounts of delays thereof are increased, and the oscillation frequency of voltage controlled oscillation circuit O31 decreases.

Voltage controlled oscillation circuit O31 is optimally designed in advance to perform free running oscillation at the designed center frequency under the condition of a predetermined power supply voltage level when reference clock signal C31 and recovered clock signal CO31 phase-synchronized with each other. Thus, even when a transistor parameter varies through the manufacturing steps, the oscillation frequency of voltage controlled oscillation circuit O31 for first reference clock signal C11 in the locked state is set to the center frequency. In specific, when the voltage level of control power supply voltage V31 rises, the frequency gain for the control voltage of voltage controlled oscillation circuit O31 is increased. Conversely, when control power supply voltage V31 decreases, the frequency gain for the control voltage of voltage controlled oscillation circuit O31 is reduced. Thereby, adjustment is performed for high-speed VCO characteristics of the voltage controlled oscillation circuit and low-speed VCO characteristics of voltage controlled oscillation circuit O31.

In the above configuration, the drive currents of delay cells D31 to D3n are directly controlled, and the changing rate of the frequency gain for the control voltage is relatively large.

Similarly, in second phase-locked loop L41, the levels of bias voltages V41 and V42 are adjusted in accordance with a phase difference between recovered clock signal CO41 and input clock signal C41. Generally, in a MOS transistor, when a back gate bias is deepened, the absolute value of the threshold voltage increases.

Bias voltages V41 and V42 are generated by bias control circuit B41 having the configuration similar to that of bias control circuit B21 shown in FIG. 2B, and are positive voltages. In this configuration, when the voltage level of bias voltage V41 goes up, the back gate bias of p-MOS transistor M45 is made shallower, and the absolute value of the threshold voltage of MOS transistor M45 is decreased. When the voltage level of bias voltage V41 is lowered, the back gate bias of p-MOS transistor M45 is made relatively deeper, and the absolute value of the threshold voltage is increased.

Similarly, in n-MOS transistor M46, when bias voltage V42 increases, the back gate bias is made shallow, and the threshold voltage thereof decreases. On the other hand, when bias voltage V42 decreases, the back gate bias is deepened, and the threshold voltage thereof increases.

Bias voltages V41 and V42 are each set to a voltage level at which p-n junction between the substrate and the drain/source of each of MOS transistors M45 and M46 is not biased in a forward direction. Therefore, the variable range of the voltage level of each of bias voltages V41 and V42 is relatively small, and the frequency gain for the control voltage of voltage controlled oscillation circuit O41 is relatively low. That is, voltage controlled oscillation circuit O41 is a "high-sensitive" voltage controlled oscillator that has the oscillation frequency less varied against the variation in the control voltage.

The drive current of voltage controlled oscillation circuit O41 is adjusted through bias voltages V41 and V42. The level of control power supply voltage V31 is so adjusted as to allow voltage controlled oscillation circuit O31 to perform free running oscillation at the center frequency. The frequency characteristics of first and second voltage controlled oscillators O31 and O41 are set identical to each other in designing stage. Hence, when the frequency gain of first voltage controlled oscillation circuit O31 is set low, the frequency gain for the control voltage of first voltage controlled oscillation circuit O31 is also made low. When the frequency gain for the control voltage of voltage controlled oscillation circuit O31 is low, the frequency gain of voltage controlled oscillation circuit O41 is also made low. Thus, after completion of the manufacturing steps, the frequency gain of voltage controlled oscillation circuit O41 is adjusted by adjusting the frequency characteristics of voltage controlled oscillation circuit O31. Concurrently, when clock signals C31 and C41 are the same in frequency, voltage controlled oscillation circuit O41 oscillates at the center frequency.

Even when the frequencies of first and second reference clock signals C31 and C41 are different from each other, as described previously, voltage controlled oscillation circuit O31 accurately reproduces a clock signal phase-synchronized with first reference clock signal C31, and the power supply voltage of second voltage controlled oscillation circuit O41 is adjusted to perform an oscillation at the middle value of the voltage range. Thus, voltage controlled oscillation circuit O41 is the "high-sensitive" oscillator and is capable of frequency-tracking second reference clock signal C41 and to be locked at the middle value of the voltage range, that is, at the center frequency. Consequently, voltage controlled oscillation circuit O41 can be controlled to oscillate accurately at the designed center frequency regardless whether the frequencies of reference clock signals C31 and C41 are the same or different even when a transistor parameter varies in a manufacturing step.

Moreover, in first voltage controlled oscillation circuit O31, the frequency gain for the control voltage is relatively high. On the other hand, second voltage controlled oscillation circuit O41 is a back gate bias adjusted oscillator and has a relatively low frequency gain for the control voltage. Hence, when the frequency gain of voltage controlled oscillation circuit O31 is varied, the frequency gain of voltage controlled oscillation circuit O41 can be greatly varied by adjusting the operation current/voltage of second voltage controlled oscillation circuit O41 (as compared to the frequency gain in the case of threshold voltage adjustment). Consequently, the frequency gain of voltage controlled oscillation circuit O41 can be greatly varied.

Even when the post-manufacture locking frequency greatly deviates from the designed central frequency in second phase-locked loop L41, the frequency gain of voltage controlled oscillation circuit O41 can be greatly varied by use of control power supply voltage V31. Concurrently, the locking frequency that greatly deviates from the designed center frequency can be set to the designed center frequency. Thus, a frequency range in which the center frequency can be corrected can be widened, thereby allowing the implementation of a phase synchronization loop stably operating over a wide frequency range.

In the configuration of the clock generator shown in FIG. 8, even when input clock signal C41 and first reference clock signal C31 are different in frequency and phase, the locking frequency for the reference clock signal such as a system clock signal in voltage controlled oscillation circuit O41 is set to the center frequency. Thus, a clock signal phase-synchronized with an input clock signal of a different frequency can be stably recovered.

Stage number changing circuits CSG1 and CSG2 each select an output signal of an odd number stage of the stages of delay cells. However, in a voltage controlled oscillator configured by the use of differential amplifier circuits coupled in a ring form, an oscillation circuit can be configured of an even number of stages of differential amplifier circuits coupled in a ring form like a delayed locked loop. Therefore, in such an arrangement, an output signal of an even number stage of differential amplifier of the differential amplification circuits may be selected, to feed back the selected output signal to the first-stage delay cell (differential amplifier).

As described above, according to the second embodiment, the operational power supply voltage adjusted to cause the voltage controlled oscillator to perform a free running oscillation at the central frequency in the first phase-locked loop is used as the power supply voltage for the voltage controlled oscillator in the second phase-locked loop for adjusting the frequency characteristics thereof. Thus, the voltage controlled oscillators capable of stably oscillating at the center frequency even when the locking frequency after manufacturing greatly deviates from the designed center frequency.

Furthermore, the voltage controlled oscillation circuit of the back gate bias adjusted type is used in the second phase-locked loop. In this case, since the frequency gain of the second voltage controlled oscillation circuit is low, the correctable range for the central frequency can be widened.

[Third Embodiment]

Figure 9:
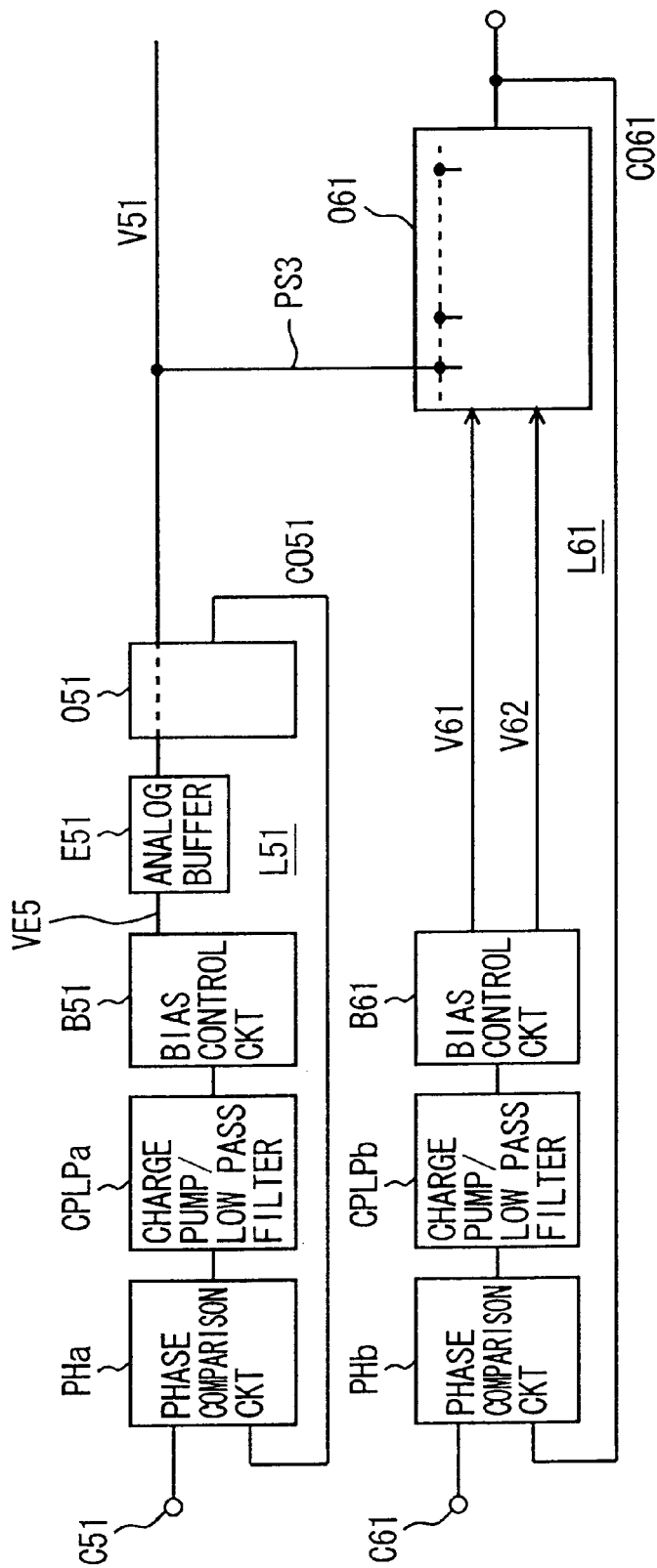
FIG. 9 schematically shows a configuration of a clock generator according to a third embodiment of the present invention.

FIG. 9 schematically shows a configuration of a clock generator according to a third embodiment of the present invention. In FIG. 9, the clock generator includes two phase-locked loops of first and second phase-locked loops L51 and L61. First phase-locked loop L51 includes: a phase comparison circuit PHa for comparing the phases of a reproduced dummy clock signal CO51 and a reference clock signal C51; a charge pump/low pass filter CPLPa for performing a charge-pumping operation in accordance with an output signal produced from phase comparison circuit PHa and a low pass-filtering processing; a bias control circuit B51 for generating a bias voltage VE5 in accordance with an output signal produced by charge pump/low pass filter CPLPa; an analog buffer E51 for performing a buffering processing on an output voltage of bias control circuit B51, for transference to a power supply line PS3; and a voltage controlled oscillation circuit O51 receiving an output voltage V51 of analog buffer E51 as an operation power supply voltage, for performing an oscillation operation.

Dummy recovered clock signal CO51 is generated by voltage controlled oscillation circuit O51 and is fed back to the phase comparison circuit PHa. Analog buffer E51 is formed of, for example, an analog amplifier of a unit gain, such as a voltage follower.

Second phase-locked loop L61 includes: a phase comparison circuit PHb for comparing the phases of a recovered clock signal CO61 and an input clock signal C61; a charge pump/low pass filter CPLPb for performing a charge-pump operation in accordance with an output signal produced by phase comparison circuit PHb and integration operation (low pass-filtering processing) on the generated voltage signal; a bias control circuit B61 for generating bias voltages V61 and V62 according to the control voltages produced by charge pump/low pass filter CPLPb; and a voltage controlled oscillation circuit O61 having an operation current adjusted according to bias voltages V61 and V62. Recovered clock signal CO61 is generated by voltage controlled oscillation circuit O61, and is fed back to phase comparison circuit PHb.

Through power supply line PS3, voltage controlled oscillation circuit O61 receives control power supply voltage V51 as one operation power supply voltage produced by analog buffer E51. Bias control circuits B51 and B61 and voltage controlled oscillators O51 and O61 have the corresponding configurations in the arrangements according to any of the first and second embodiments.

In the configuration shown in FIG. 9, analog buffer E51 is used to buffer bias voltage VE5 produced by bias control circuit B51 for application to voltage controlled oscillators O51 and O61 as an operational power supply voltage. Thus, the power supply voltage can be stably supplied to voltage controlled oscillators O51 and O61 by analog buffer E51. Thereby, voltage controlled oscillation circuit O51 stably oscillates at the central frequency in accordance with reference clock signal C51. Similarly, when input clock signal C61 is the same in frequency as reference clock signal C51, voltage controlled oscillation circuit O61 can stably oscillates at the central frequency. In addition, even when the frequency of input clock signal C61 is different from that of reference clock signal C51, voltage controlled oscillation circuit O61 can be controlled to stably oscillate at the middle value of the voltage-range, that is, the central frequency, by using configurations according to the modifications of the first embodiment and to the second embodiment.

Furthermore, with the analog buffer E51, the frequency characteristics of voltage controlled oscillators O51 and O61 can be corrected only by adjusting the power-supply voltage levels without consideration on the current amount supplied from bias control circuit B51.

Figure 10:
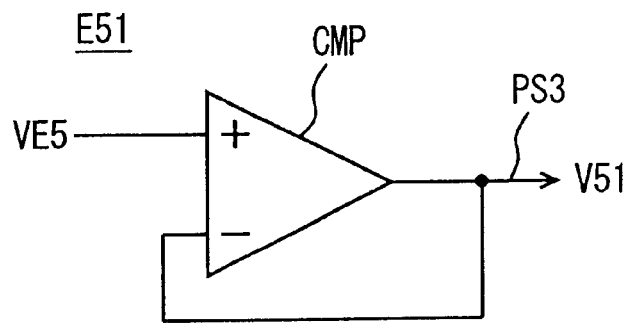
FIG. 10 shows an example of the configuration of an analog buffer shown in FIG. 9.

FIG. 10 shows an example of configuration of analog buffer E51 shown in FIG. 9. Referring to FIG. 10, analog buffer E51 includes a comparator CMP that receives bias voltage VE5 and control power supply voltage V51 from bias control circuit B51 and that transfers an output signal thereof to power supply line PS3. Comparator CMP is formed of, for example, a differential amplifier, and receives bias voltage VE5 from bias control circuit B51 at its positive input, and control power supply voltage V51 at its negative input.

When control power supply voltage V51 is lower than bias voltage VE5, comparator CMP functions to raise the level of control power supply voltage V51 on power supply line PS3. Conversely, when control power supply voltage V51 is higher than bias voltage VE5, comparator CMP functions to lower the level of control power supply voltage V on power supply line PS3. Thus, comparator CMP produces control power supply voltage V51 of the same voltage level as that of bias voltage VE5 on power supply line PS3. Comparator CMP is a so-called voltage follower. When the voltage follower is of a unit gain type, bias voltage VE5 and control power supply voltage V51 can be set to the same voltage level.

Comparator CMP is merely required to be a voltage follower of a unit gain, and the internal configuration thereof may be any.

As described above, according to the third embodiment of the present invention, the bias control voltage is analogously buffered to generate the control power supply voltage on the power supply line, to be supplied to the first and second voltage controlled oscillation circuits. Thus, in addition to the advantages obtained in the first and second embodiments, the operation power supply voltages can be supplied to these voltage controlled oscillation circuits, thereby allowing the oscillation circuits to stably oscillate.

[Fourth Embodiment]

Figure 11:
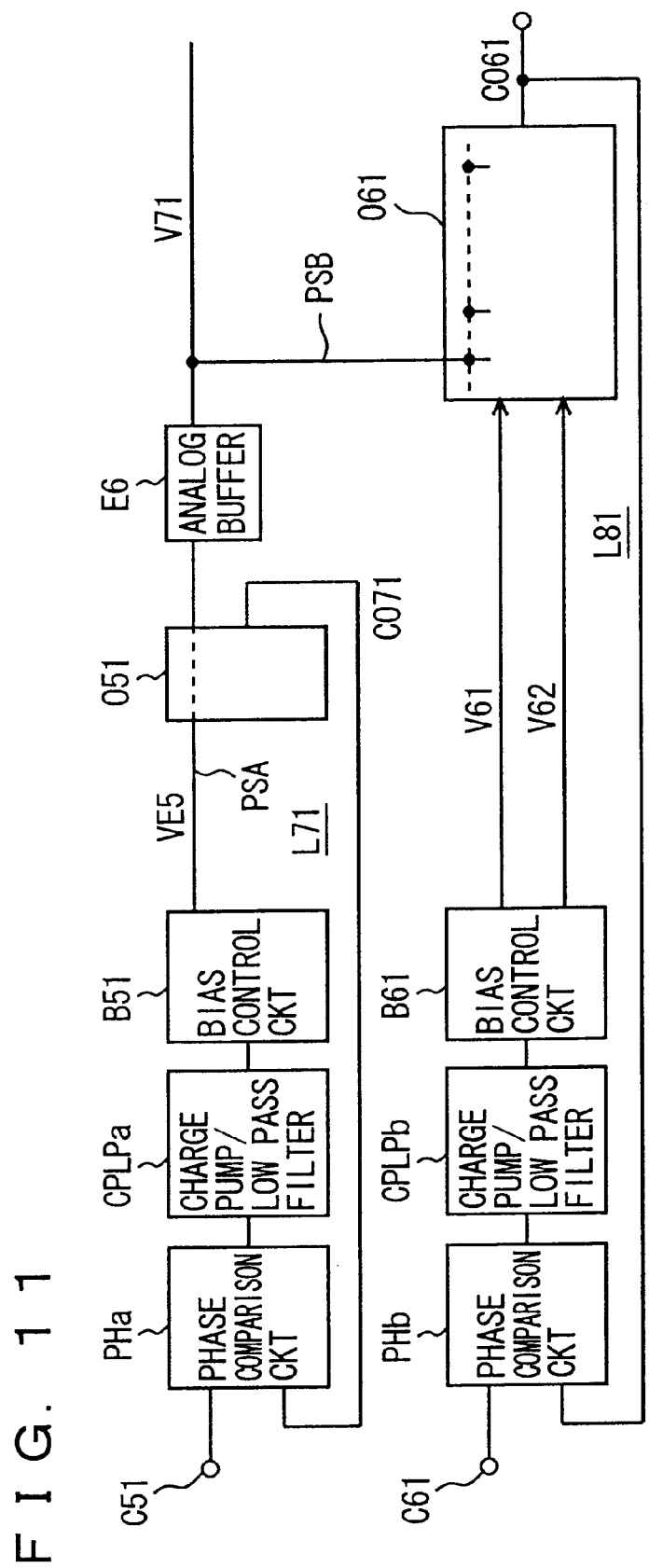
FIG. 11 schematically shows a configuration of a clock generator according to a fourth embodiment of the present invention.

FIG. 11 schematically shows a configuration of a clock generation circuit according to a fourth embodiment of the present invention. Referring to FIG. 11, the clock generation circuit includes first and second phase-locked loops L71 and L81. The clock generation circuit shown in FIG. 11 is different in configuration from the clock generation circuit shown in FIG. 9 in the following point. In first phase-locked loop L71, a control power supply voltage VE5 produced from bias control circuit O51 is transferred to a power supply line PSA of a first voltage controlled oscillation circuit O51. Control power supply voltage (bias voltage) VE5 on power supply line PSA is converted via an analog buffer E6 to a control power supply voltage V71. Control power supply voltage V71 is then supplied as a control power supply voltage to a voltage controlled oscillation circuit O81 via a power supply line PSB.

Configuration of other portions of phase-locked loop L71 is the same as the configuration shown in FIG. 9. The corresponding portions are allotted with the same reference numerals/characters, and detailed descriptions thereof are omitted. In the configuration, dummy recovered clock signal CO61 is generated by voltage controlled oscillation circuit O51, and is supplied to the phase comparison circuit PHa. This is the same as that in above-descried embodiments, except for the names and reference numeral/character.

Second phase-locked loop L81 has the same configuration as second phase-locked loop L61 shown in FIG. 9. The corresponding portions are allotted with the same reference numerals/characters, and detailed description thereof is omitted.

In the configuration shown in FIG. 11, power supply line PS is split into power supply lines PSA and PSB. Power supply line PSA transfers control power supply voltage VE5 from bias control circuit B51 to first voltage controlled oscillation circuit O51. Power supply line PSB transfers control power supply voltage V71 from analog buffer E6 to voltage controlled oscillation circuit O61. The power sources for voltage controlled oscillators O51 and O61 are electrically isolated by analog buffer E6. Therefore, even when voltage controlled oscillation circuit O61 operates and causes a variation in the voltage level of control power supply voltage V71 on power supply line PSB, the variation can be prevented from being transferred to power supply line PSA for first voltage controlled oscillation circuit O51. Thus, first phase-locked loop L71 is allowed to stably oscillate at the central frequency in accordance with reference clock signal C51. Accordingly, since stable bias voltage VE5 can be generated, second voltage controlled oscillation circuit O61 is allowed to stably oscillate. Noise interference between phase-locked loops L71 and L81 can be suppressed and these phase-locked loops can stably oscillate. In addition, second voltage controlled oscillation circuit O61 can stably receive control power supply voltage V71 from analog buffer E6 through power supply line PSB.

Analog buffer E6 may be configured of a voltage follower of a unit gain as shown in FIG. 10, or may be formed of any other circuit configuration.

[Fifth Embodiment]

Figure 12:
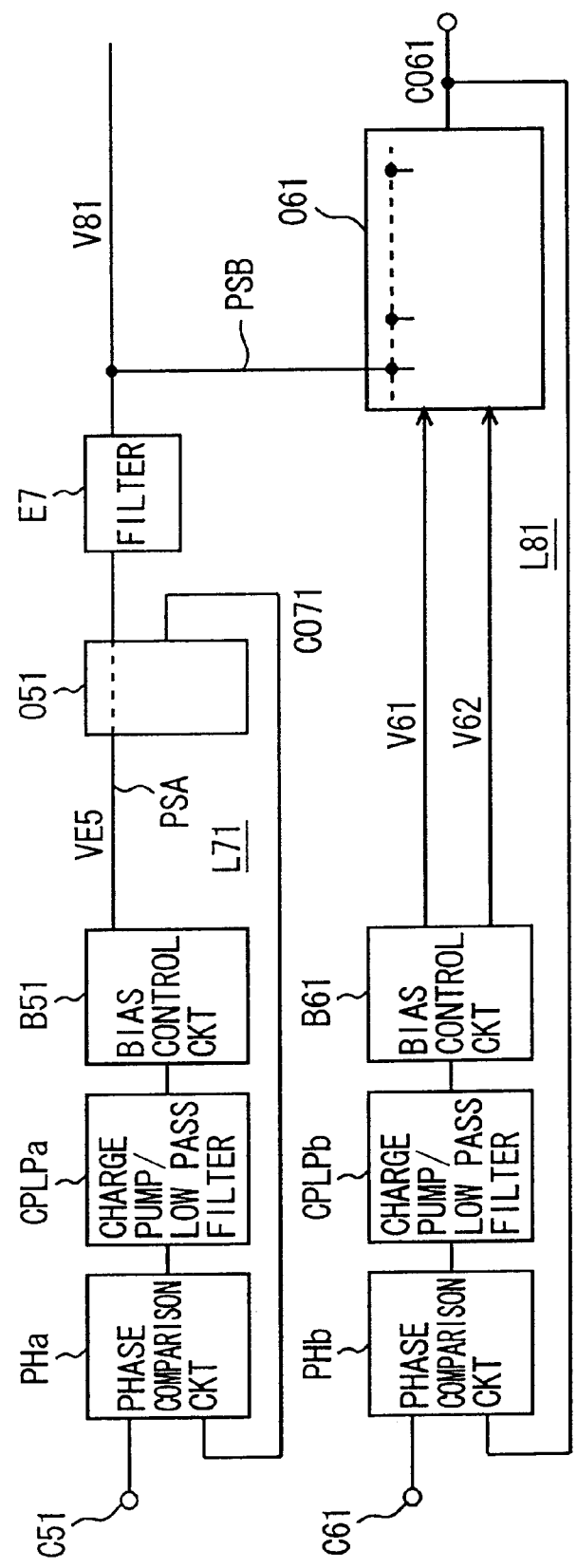
FIG. 12 schematically shows a configuration of a clock generator according to a fifth embodiment of the present invention.

FIG. 12 schematically shows a configuration of a clock generation circuit according to a fifth embodiment of the present invention. The clock generation circuit shown in FIG. 12 is different from the clock generation circuit shown in FIG. 11 in the following point. Instead of analog buffer E6, a filter E7 for removing high frequency components is provided between power supply lines PSA and PSB. The configuration of other portions is the same as the configuration shown in FIG. 11. The corresponding portions are denoted with the same reference numerals/characters, and detailed descriptions thereof are omitted.

Filter E7 functions as a low pass filter that removes high frequency components of control power supply voltage VE5 supplied from bias control circuit B51 to power supply line PSA. Consequently, a control power supply voltage V81 to be supplied to voltage controlled oscillation circuit O61 via power supply line PSB is made a stable control power supply voltage from which high frequency components are removed. Furthermore, filter E7 functions to suppress noise interference between power supply lines PSA and PSB, thereby enabling first and second phase-locked loops L71 and L81 to stably operate.

Figure 13:
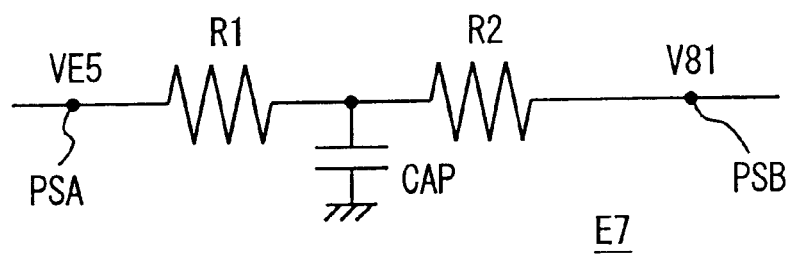
FIG. 13 shows an example configuration of a filter shown in FIG. 12.

FIG. 13 shows an example of the configuration of the filter E7 shown in FIG. 12. Referring to FIG. 13, filter E7 includes resistance elements R1 and R2 connected in series between power supply lines PSA and PSB, and a capacitance element CAP connected between a ground node and a connection node of resistance elements R1 and R2. With resistance elements R1 and R2, high frequency noise components of control power supply voltage VE5 can be prevented from being transferred to control power supply voltage V81. Furthermore, the high frequency noise components of control power supply voltage V81 can be prevented from being transferred to control power supply voltage VE5.

Therefore, noise interference between these power supply lines PSA and PSB can be reliably suppressed. Consequently, control power supply voltage VE5 and control power supply voltage V81 can be stably generated to cause voltage controlled oscillators O51 and O61 to oscillate.

The configuration of filter E7 shown in FIG. 13 is provided by way of example. Filter E7 may be formed of any low pass filter circuit as far s the filter can remove high frequency components.

As described above, according to the fifth embodiment of the present invention, the filter is inserted between the first and second voltage controlled oscillators. Thus, power supply noise of the voltage controlled oscillators can be suppressed, and the first and second phase-synchronization loops can be stably operated.

[Sixth Embodiment]

Figure 14:
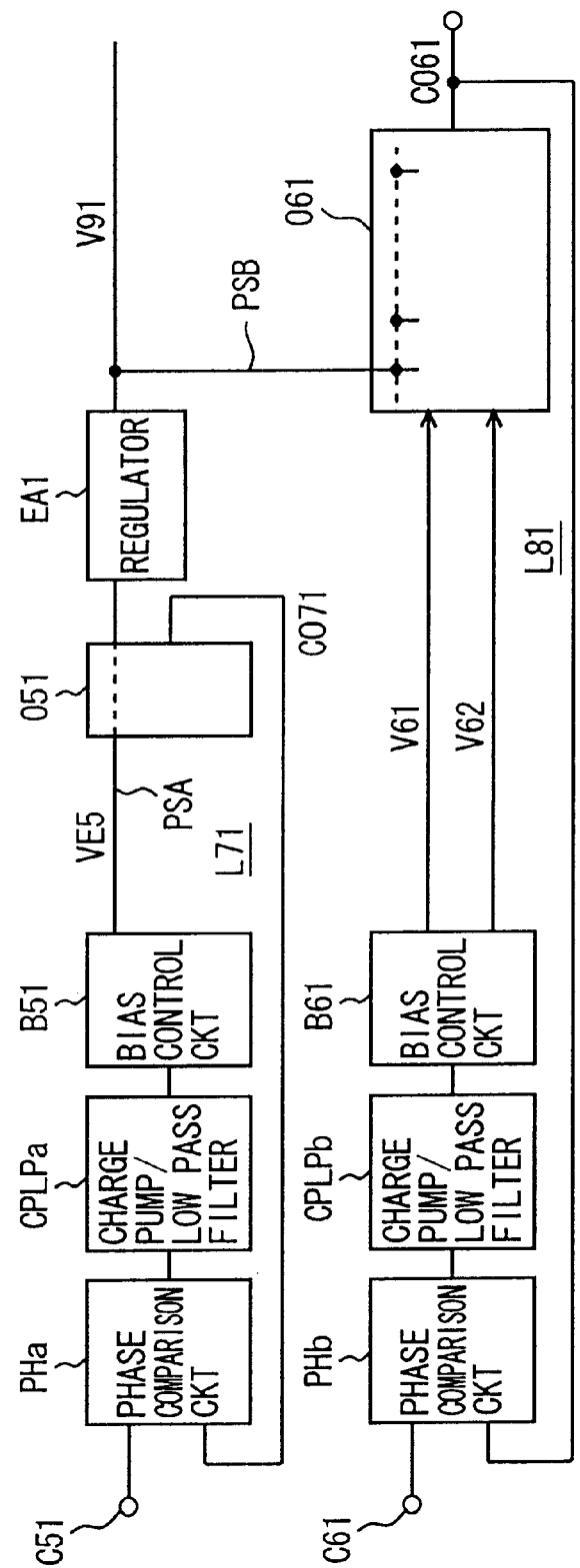
FIG. 14 schematically shows a configuration of a clock generator according to a sixth embodiment of the present invention.

FIG. 14 schematically shows a configuration of a clock generation circuit according to a sixth embodiment of the present invention. The clock generation circuit shown in FIG. 14 is different from the clock generators shown in FIGS. 11 and 12 in the point that a regulator EA1 is provided between power supply line PSA for voltage controlled oscillation circuit O51 and power supply line PSB for voltage controlled oscillation circuit O61. Regulator EA1 electrically isolates these power supply lines PSA and PSB. The configuration of other portions is the same as that shown in FIGS. 11 and 12. The corresponding portions are denoted with the same reference numerals/characters, and detailed descriptions thereof are omitted.

Regulator EA1 monitors the voltage level of control power supply voltage VE5 on power supply line PSA, and adjusts the voltage level of a control power supply voltage V91 for voltage controlled oscillation circuit O61 in accordance with the result of monitoring. In addition, as mentioned above, regulator EA1 electrically separates power supply lines PSA and PSB from each other. Thereby, as in the fourth and fifth embodiments, noise interference between first and second phase-locked loops L71 and L81 is suppressed, and phase-locked loops L71 and L81 can be operated stably.

Figure 15:
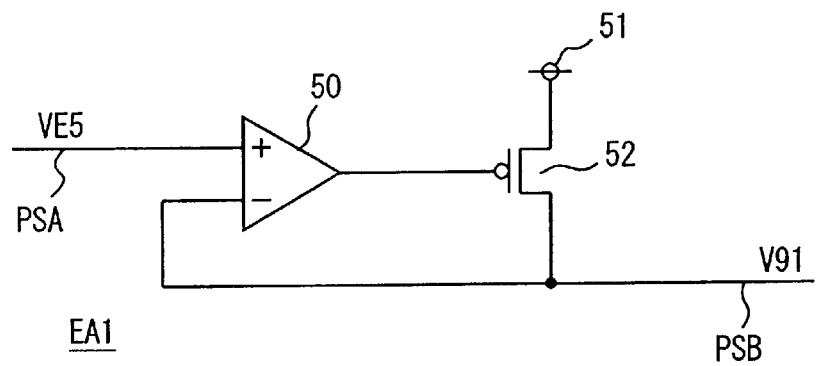
FIG. 15 shows an example of the configuration of a regulator shown in FIG. 14.

FIG. 15 shows an example of the configuration of the regulator EA1 shown in FIG. 14. In FIG. 15, regulator EA1 includes: a comparator 50 for comparing control power supply voltage VE5 on power supply line PSA and control power supply voltage V91 of power supply line PSB; and a current-drive transistor 52 formed of a p-MOS transistor, for supplying a current from a power supply node 51 to power supply line PSB in response to an output signal of comparator 50.

Comparator 50 supplies, to a gate of current drive transistor 52, a voltage according to the potential difference between control power supply voltage VE5 and control power supply voltage V91. Comparator 50 is configured such that the voltage of its own output signal is reduced as control power supply voltage VE5 is made higher than control power supply voltage V91. In response to the output signal of comparator 50, the conductance of current-drive transistor 52 varies. When control power supply voltage VE5 is higher than control power supply voltage V91, current is supplied from power supply node 51 to power supply line PSB through current-drive transistor 52, and the level of control power supply voltage V91 rises accordingly.

Therefore, the voltage level of control power supply voltage V91 is maintained at a voltage level corresponding to the voltage level of control power supply voltage VE5 through the feed back loop of comparator 50 and current drive transistor 52. Comparator 50 is formed of, for example, a differential amplification circuit, and receives control power supply voltage VE5 and control power supply voltage V91 at the gates of the included MOS transistors for comparison. In this case, since power supply lines PSA and PSB are electrically separated, noise on power supply line PSB can be prevented from being transferred to power supply line PSA. Furthermore, control power supply voltage V91 is generated from the current supplied to power supply line PSB through current-drive transistor 52. Thus, control power supply voltage V91 can be stably generated onto power supply line PSB to operate voltage controlled oscillation circuit O61 in second phase-locked loop L81 stably.

Figure 16:
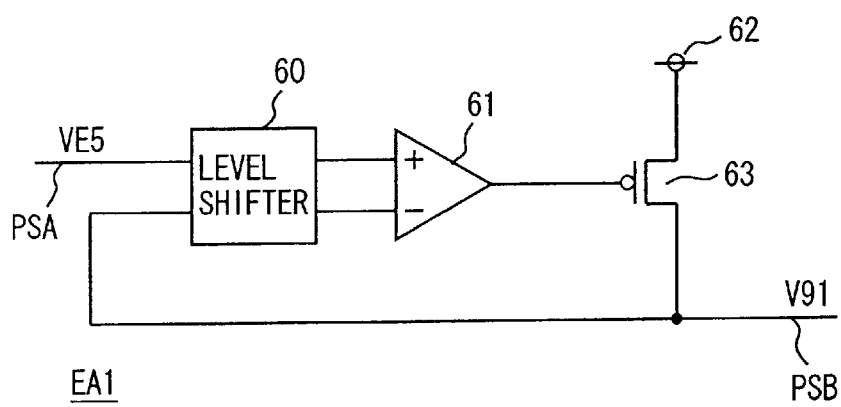
FIG. 16 shows a modification of the regulator shown in FIG. 14.

Modification of Sixth Embodiment:

FIG. 16 shows a modification of regulator EA1 shown in FIG. 14. Regulator EA1 shown in FIG. 16 includes a level shifter 60 that converts the voltage levels of control power supply voltages VE5 and V91. A level-converted control power supply voltage from level shifter 60 is supplied to a comparison circuit 61. In response to an output signal of comparison circuit 61, a current-drive transistor 63 supplies current to power supply line PSB from a power supply node 62.

With level shifter 60 to adjust the voltage levels of control power supply voltages VE5 and V91, comparison circuit 61 can be operated in the most sensitive region. With the sensitivity of comparison circuit 61 enhanced, the voltage level of control power supply voltage V91 can be adjusted according to control power supply voltage VE5.

Figure 17:
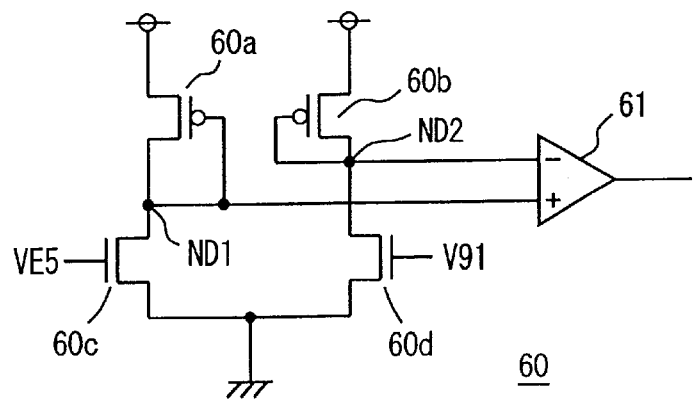
FIG. 17 shows an example configuration of a level shifter shown in FIG. 16.
Figure 18:
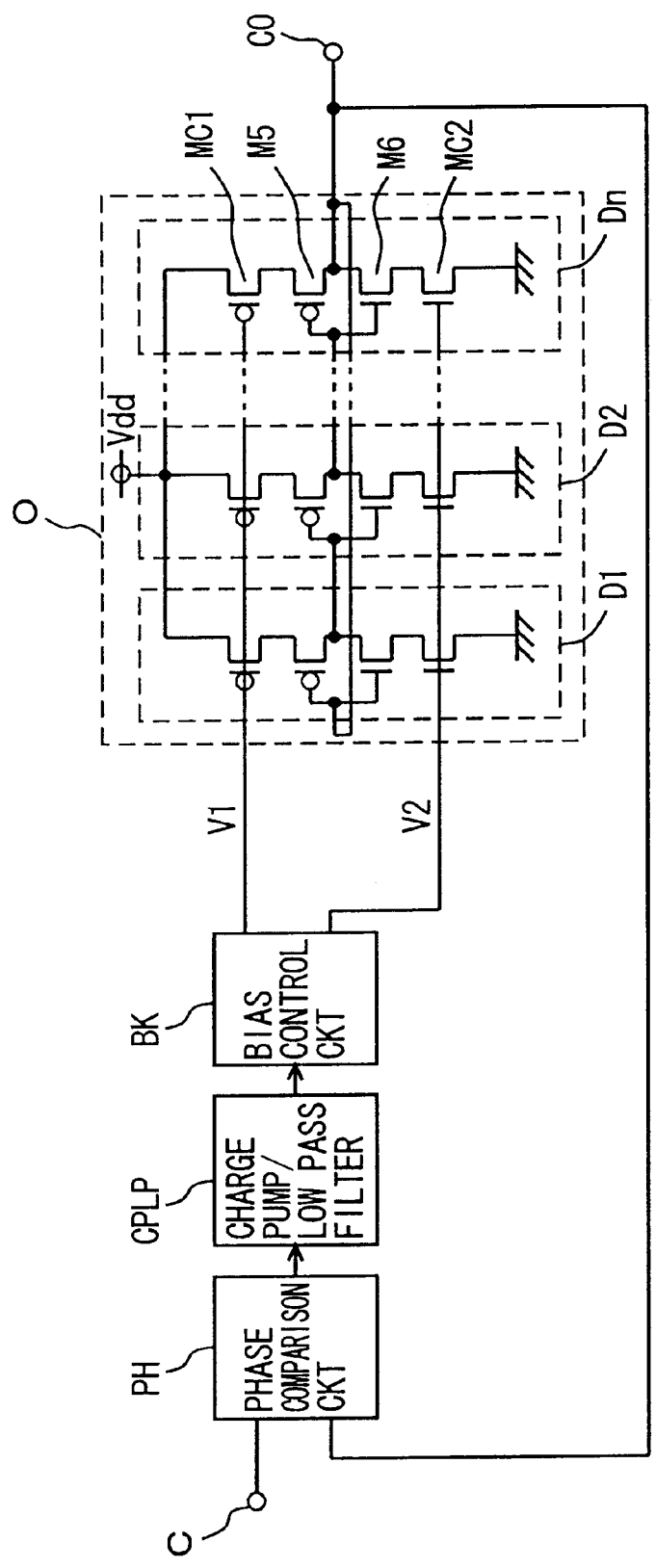
FIG. 18 shows an example of the configuration of a conventional clock generator.
Figure 19:
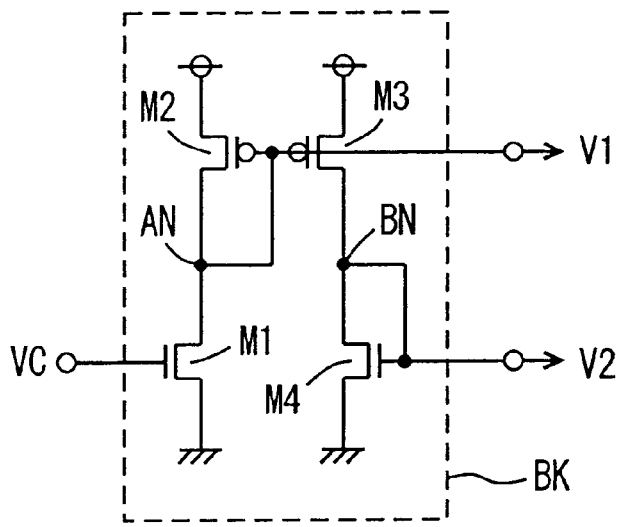
FIG. 19 shows an example of the configuration of a bias control circuit shown in FIG. 18.
Figure 20:
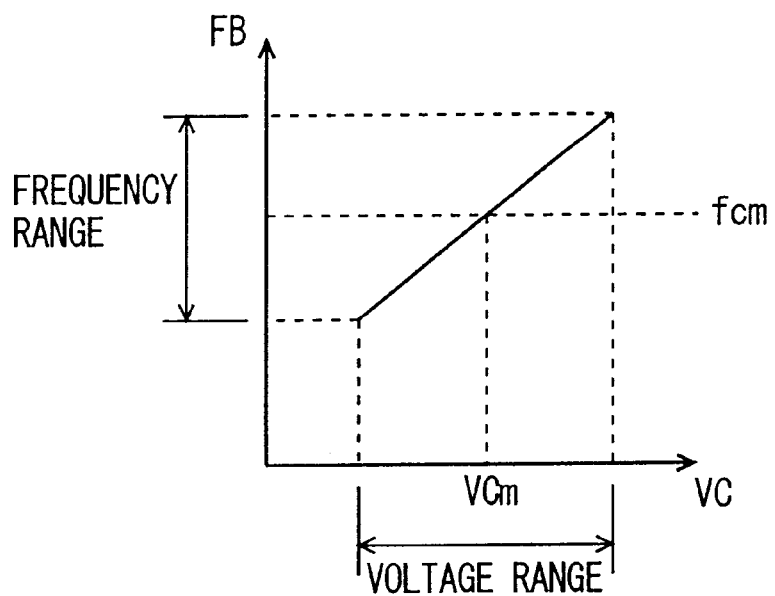
FIG. 20 shows frequency characteristics of the clock generator shown in FIG. 18.
Figure 21:
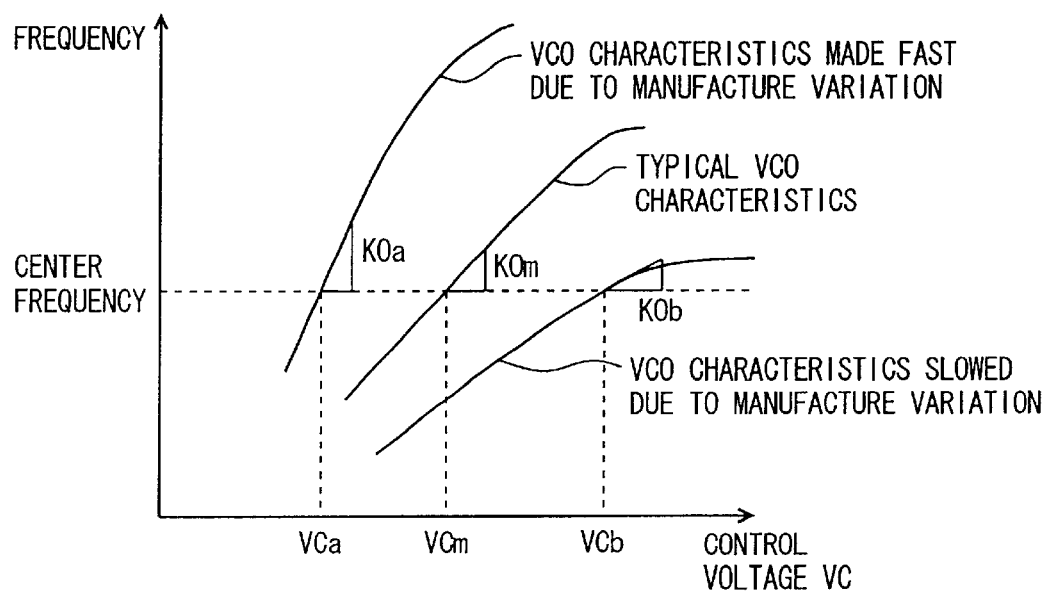
FIG. 21 shows variations in frequency characteristics of the clock generator due to a manufacturing parameter.

FIG. 17 shows an example of the configuration of level shifter 60 shown in FIG. 16. Referring to FIG. 17, level shifter 60 includes a p-MOS transistor 60a connected between a power supply node and a node ND1 and having a gate connected to node ND1, a p-MOS transistor 60b connected between the power supply node and a node ND2 and having a gate connected to node ND2, and an n-MOS transistor 60c connected between node ND1 and the ground node and having a gate receiving control voltage VE5, and an n-MOS transistor 60d connected between the ground node and node ND2 and having a gate receiving control voltage V91.

Control power supply voltages VE5 and V91 are each at a voltage level near the power supply voltage level. Accordingly, the conductance of each of MOS transistors 60c and 60d is large. On the other hand, the voltage levels of nodes ND1 and ND2 are set according to the amounts of the currents supplied by the respective MOS transistors 60a and 60b. Hence, the voltage level of each of nodes ND1 and ND2 can be set to an intermediate voltage level lower than the power supply voltage. Thus, the voltage levels of nodes ND1 and ND2 can be set to a region in which comparison circuit 61 stably operates. Comparison circuit 61 receives the voltage of node ND1 and the voltage of node ND2 at respective positive and negative inputs, for comparison.

As described above, according to the sixth embodiment of the present invention, the voltage of the power supply line for the voltage controlled oscillator in the first phase-locked loop is coupled via the regulator to the power supply line for the voltage controlled oscillator in the second phase-locked loop. Therefore, noise interference between the first and second phase-locked loops can be suppressed. Furthermore, by the use of the regulator, the control power supply voltage can stably be supplied as the operation power supply voltage to the second phase-locked loop. Thus, the second voltage controlled oscillation circuit can stably oscillate.

[Other Embodiments]

In each of the phase-locked loops, the phase comparison circuit may be replaced with a phase-and-frequency comparator that performs comparisons of both the phase and frequency. In this case, the control voltage is generated in accordance with the phase difference as well as the frequency difference.

The configuration of the bias control circuit is not limited to that shown in one of those shown in FIGS. 2A and 2B, and the configuration thereof may be any as long as the bias control voltage (control power supply voltage) is generated according to a control voltage generated by a charge pump and a loop filter.

In the voltage controlled oscillator according to each of the above-described embodiments, the CMOS inverter delay stages are coupled in a ring form. However, an odd number of stages or an even number of stages of differential amplifiers for inputting and outputting complementary signals may be coupled in a ring form.

The voltage controlled oscillator may be replaced with a delayed locked loop (DLL) that delays an input clock signal to generate an internal clock signal phase-synchronized with the input clock signal.

As described above, according to the present invention, two phase-locked loops that have the same operational characteristics are provided and one of the phase-locked loops has the power supply voltage for the oscillation circuit is adjusted so that the phase-locked loop operates in synchronization with the reference clock signal. The adjusted power supply voltage for the oscillation circuit is used as a power supply voltage for the oscillation circuit in the other phase-locked loop (second phase-locked loop). Thus, the clock generation circuit is achieved which stably oscillate at the central frequency, even when transistor characteristics are varied according to a variation in, for example, a manufacturing parameter.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A clock generation circuit comprising:
   first oscillation circuitry;
   power supply control circuitry for adjusting a level of a voltage on a power supply line for said first oscillation circuitry in accordance with a phase difference between an oscillation signal of the first oscillation circuitry and a first reference clock signal;
   second oscillation circuitry receiving said power supply voltage on said power supply line, for performing an oscillation operation; and
   bias control circuitry for adjusting an operation speed of said second oscillation circuitry in accordance with an output signal of said second oscillation circuitry and a second reference clock signal.

2. The clock generation circuit according to claim 1, wherein said first oscillation circuitry and said second oscillation circuitry are the same in operation characteristics.

3. The clock generation circuit according to claim 1, wherein
   said second oscillation circuitry comprises a plurality of cascaded delay stages each including a current source transistor coupled to said power supply line; and
   said bias control circuitry adjusts a drive current of said current source transistor in each respective delay stage.

4. The clock generation circuit according to claim 3, wherein
   said first oscillation circuitry comprises a plurality of cascaded delay stages each having an operation current determined according to a reference voltage at a predetermined level.

5. The clock generation circuit according to claim 1, wherein
   a variation rate of an oscillation frequency of said second oscillation circuitry through adjustment by said bias control circuitry is smaller than a variation rate of the oscillation frequency of said first oscillation circuitry due to variation of the power supply voltage of said first oscillation circuitry.

6. The clock generation circuit according to claim 1, wherein
   said second oscillation circuit comprises a plurality of cascaded delay stages each comprising an insulated gate field effect transistor having a back gate; and
   said bias control circuitry adjusts a potential of said back gate of said insulated gate field effect transistor in each delay stage of said second oscillation circuitry.

7. The clock generation circuit according to claim 6, wherein
   said first oscillation circuit comprises a plurality of cascaded delay stages each comprising an insulated gate field effect transistor having a back gate connected to a source thereof.

8. The clock generation circuit according to claim 1, wherein said power supply control circuitry comprises:
   a phase control circuit for generating a phase control signal in accordance with the phase difference between said first reference clock signal and the output signal of said first oscillation circuitry; and
   a buffer circuit for buffering an output signal of said phase control circuit for transference to said power supply line.

9. The clock generation circuit according to claim 8, wherein said buffer circuit comprises an analog buffer.

10. The clock generation circuit according to claim 8, wherein said buffer circuit electrically isolates an output of said phase control circuit from said power supply line.

11. The clock generation circuit according to claim 8, wherein said power supply line comprises:
    a first power line coupled between said phase control circuit and a power source; and
    a second power line coupled to said first power line via said buffer circuit and coupled to a power supply for said second oscillation circuitry.

12. The clock generation circuit according to claim 8, wherein said buffer circuit transfers a buffered phase control signal to said first oscillation circuit and said second oscillation circuit via said power supply line.

13. The clock generation circuit according to claim 1, wherein said power supply control circuitry comprises:
    a phase control circuit for generating a phase control signal in accordance with the phase difference between said first reference clock signal and the output signal of said first oscillation circuit; and
    a filter circuit for filtering the phase control signal received from said phase control circuit for transference to said power supply line.

14. The clock generation circuit according to claim 1, wherein said power supply control circuitry comprises:
    a phase control circuit for generating a phase control signal in accordance with the phase difference between said first reference clock signal and the output signal of said first oscillation circuit; and
    a regulator for setting a potential of said power supply line in accordance to the phase control signal received from said phase control circuit.

15. The clock generation circuit according to claim 14, wherein said regulator comprises:
    a comparison circuit for comparing the phase control signal and the potential of said power supply line; and a current-driving circuit for causing a current to flow between said power supply line and a predetermined power supply node, in response to an output signal of said comparison circuit, for adjusting the potential of said power supply line.

16. The clock generation circuit according to claim 15, wherein said regulator comprises at least a circuit for converting a potential level of said phase control signal.

17. The clock generation circuit according to claim 1, wherein said first oscillation circuitry further comprises a frequency-dividing circuit for frequency-dividing an oscillation signal thereof, for supplying the frequency-divided signal to said power supply control circuitry.

18. The clock generation circuit according to claim 1, further comprising a frequency-dividing circuit for frequency-dividing a third reference clock signal to generate said first reference clock signal.

19. The clock generation circuit according to claim 1, wherein
- each of said first oscillation circuitry and said second oscillation circuitry comprises cascaded delay stages; and
- said clock generation circuit further comprises a stage number changing circuit for changing the number of delay stages of said first oscillation circuitry and the number of delay stages of said second oscillation circuitry.

* * * * *